(12) United States Patent
Jobetto

(10) Patent No.: US 8,268,674 B2
(45) Date of Patent: Sep. 18, 2012

(54) SEMICONDUCTOR DEVICE AND METHOD FOR MANUFACTURING THE SAME

(75) Inventor: Hiroyasu Jobetto, Hachioji (JP)

(73) Assignee: Teramikros, Inc., Tokyo (JP)

( * ) Notice: Subject to any disclaimer, the term of this patent is extended or adjusted under 35 U.S.C. 154(b) by 204 days.

(21) Appl. No.: 12/849,529

(22) Filed: Aug. 3, 2010

(65) Prior Publication Data
US 2010/0317154 A1 Dec. 16, 2010

Related U.S. Application Data

(62) Division of application No. 12/187,699, filed on Aug. 7, 2008, now abandoned.

(30) Foreign Application Priority Data

Aug. 8, 2007 (JP) ................................ 2007-206067
Sep. 27, 2007 (JP) ................................ 2007-250952

(51) Int. Cl.
H01L 21/00 (2006.01)
(52) U.S. Cl. ........ 438/110; 438/106; 257/698; 257/700; 257/E21.532
(58) Field of Classification Search ................ 257/698, 257/700, E21.532; 438/106, 110
See application file for complete search history.

(56) References Cited

U.S. PATENT DOCUMENTS

| | | | |
|---|---|---|---|
| 5,497,033 A | 3/1996 | Fillion et al. | |
| 6,154,366 A | 11/2000 | Ma et al. | |
| 6,489,685 B2 | 12/2002 | Asahi et al. | |
| 7,294,922 B2 | 11/2007 | Jobetto et al. | |
| 7,615,411 B2 | 11/2009 | Jobetto | |
| 7,709,942 B2 | 5/2010 | Jobetto | |
| 2002/0135058 A1 | 9/2002 | Asahi et al. | |
| 2004/0082100 A1 | 4/2004 | Tsukahara et al. | |
| 2004/0201085 A1 | 10/2004 | Ogawa et al. | |
| 2004/0245614 A1* | 12/2004 | Jobetto | ........................ 257/678 |
| 2005/0140007 A1 | 6/2005 | Jobetto | |

(Continued)

FOREIGN PATENT DOCUMENTS
CN 1366446 A 8/2002
(Continued)

OTHER PUBLICATIONS

Korean Office Action dated Mar. 22, 2011 (and English translation thereof) in counterpart Korean Application No. 10-2009-7026470.

(Continued)

Primary Examiner — N Drew Richards
Assistant Examiner — Yu-Hsi D Sun
(74) Attorney, Agent, or Firm — Holtz, Holtz, Goodman & Chick, PC

(57) ABSTRACT

A semiconductor device includes a semiconductor constituent provided with a semiconductor substrate and a plurality of electrodes for external connection provided under the semiconductor substrate. A lower-layer insulating film is provided under and around the semiconductor constituent. A plurality of lower-layer wirings are electrically connected to the electrodes for external connection of the semiconductor constituent, and provided under the lower-layer insulating film. An insulation layer is provided on the lower-layer insulating film in the periphery of the semiconductor constituent. An upper-layer insulating film is provided on the semiconductor constituent and the Insulation layer. A plurality of upper-layer wirings are provided on the upper-layer insulating film. A base plate on which the semiconductor constituent and the insulation layer are mounted is removed.

15 Claims, 28 Drawing Sheets

U.S. PATENT DOCUMENTS

| | | | |
|---|---|---|---|
| 2005/0140021 A1* | 6/2005 | Wakisaka et al. | 257/777 |
| 2005/0161803 A1* | 7/2005 | Mihara | 257/698 |
| 2005/0269698 A1* | 12/2005 | Okada et al. | 257/737 |
| 2006/0046350 A1 | 3/2006 | Jiang et al. | |
| 2006/0125082 A1 | 6/2006 | Wakabayashi et al. | |
| 2007/0001293 A1 | 1/2007 | Jiang et al. | |
| 2007/0042594 A1 | 2/2007 | Wakabayashi et al. | |
| 2007/0200217 A1 | 8/2007 | Tsukahara et al. | |
| 2008/0014681 A1 | 1/2008 | Jobetto | |
| 2008/0166836 A1 | 7/2008 | Jobetto | |

FOREIGN PATENT DOCUMENTS

| | | |
|---|---|---|
| CN | 1723556 A | 1/2006 |
| EP | 1 225 629 A2 | 7/2002 |
| JP | 2000-223518 A | 8/2000 |
| JP | 2005-159199 A | 6/2005 |
| JP | 2005-191156 A | 7/2005 |
| JP | 2005-216935 A | 8/2005 |
| JP | 2006-173285 A | 6/2006 |
| JP | 2007-67098 A | 3/2007 |
| KR | 10-2002-0062227 A | 7/2002 |
| KR | 10-2004-0060843 A | 7/2004 |
| KR | 10-2005-0087872 A | 8/2005 |
| WO | WO 2007/080713 A1 | 7/2007 |

OTHER PUBLICATIONS

Korean Office Action dated Nov. 28, 2011 (and English translation thereof) in counterpart Korean Application No. 10-2009-7026470.

Chinese Office Action dated Jan. 19, 2011 and English translation thereof in counterpart Chinese Application No. 2008800220926.

Hiroyasu Jobetto, "Semiconductor Device and Manufacturing Method Thereof," related U.S. Appl. No. 12/187,766, filed Aug. 7, 2008.

International Search Report and Written Opinion of the International Searching Authority dated Jan. 12, 2009, issued in International Application No. PCT/JP2008/064560.

International Search Report and Written Opinion of the International Searching Authority dated Mar. 9, 2009, issued in International Application No. PCT/JP2008/064559.

Japanese Office Action dated Jul. 26, 2011 (and English translation thereof) in counterpart Japanese Application No. 2007-250952.

Japanese Office Action dated Nov. 30, 2010 (and English translation thereof) in counterpart Japanese Application No. 2007-250952.

Japanese Office Action dated May 22, 2012 (and English translation thereof) in counterpart Japanese Application No. 2007-206067.

* cited by examiner

SEMICONDUCTOR DEVICE AND METHOD FOR MANUFACTURING THE SAME

CROSS-REFERENCE TO RELATED APPLICATIONS

This application is a Divisional Application of U.S. application Ser. No. 12/187,699, filed Aug. 7, 2008 now abandoned, which is based upon and claims the benefit of priority from prior Japanese Patent Applications No. 2007-206067, filed Aug. 8, 2007; and No. 2007-250952, filed Sep. 27, 2007, the entire contents of all of which are incorporated herein by reference.

BACKGROUND OF THE INVENTION

1. Field of the Invention

The present invention relates to a semiconductor device and a method for manufacturing the same, and particularly to a semiconductor device with a built-in semiconductor constituent and a method for manufacturing the same.

2. Description of the Related Art

As a conventional semiconductor device, there is known a chip size package (CSP) as disclosed in Jpn. Pat. Appln. KOKAI Publication No. 2000-223518, for example. The semiconductor device disclosed in this document can be obtained by providing a plurality of columnar electrodes for external connection under a silicon substrate and sealing clearances between the columnar electrodes under this condition. In this kind of the CSP, since a semiconductor package of the same size as that of a silicon substrate is obtained, the semiconductor device is miniaturized, and the packaging density can be increased. However, this kind of conventional semiconductor device has (Fan-in) structure in which electrodes for external connection are provided in a flat area region of a semiconductor constituent. Consequently, in the case where the number of arrangements of electrodes for external connection increases and the arrangement pitch becomes smaller than a predetermined size, for example, about 0.5 μm, this kind of semiconductor device cannot be applied.

Therefore, a device according to Jpn. Pat. Appln. KOKAI Publication No. 2005-216935 adopts a Fan-out configuration in which a semiconductor constituent called a CSP is mounted on a base plate that has a plane size larger than the relevant semiconductor constituent, and the semiconductor constituent mounted on this base plate is covered with a sealing film to be hermetically sealed, and a nearly whole area that corresponds to one surface of the base plate is used for an area in which to arrange electrodes for external connection of the semiconductor constituent. Under this kind of configuration, a sufficiently large area can be secured to arrange electrodes for external connection, and therefore, even when electrodes for external connection are extremely large, the size and the pitch of each electrode for external connection can be successfully secured.

However, in the above-mentioned conventional semiconductor device, a base plate to mount the semiconductor constituent is required, and this base place that causes the whole device to be thick has posed a serious problem.

BRIEF SUMMARY OF THE INVENTION

An object of the present invention is to provide a semiconductor device capable of having a low-profile design in a semiconductor device whose arrangement area of electrodes for external connection is larger than the plane surface size of the semiconductor constituent, and a method for manufacturing the same.

According to another aspect of the present invention, there is provided a method for manufacturing a semiconductor device, comprising: forming a lower-layer insulating film on a base plate; firmly fixing, on the lower-layer insulating film, a plurality of semiconductor constituents having a semiconductor substrate and a plurality of electrodes for external connection provided under the semiconductor substrate; forming an insulation layer on the lower-layer insulating film in the periphery of the semiconductor constituent and forming an upper-layer insulating film on the semiconductor constituent and the insulation layer. The method then removes the base plate; forms lower-layer wirings connected with the electrodes for external connection of the semiconductor constituent under the lower-layer insulating film and forming upper-layer wirings on the upper-layer insulating film. Thereafter, a plurality of semiconductor devices are obtained by cutting the lower-layer insulating film, the insulation layer, and the upper-layer insulating film between the semiconductor constituents.

According to the invention, the area in which to arrange the electrodes for external connection can be made larger than the plane size of the semiconductor constituent. Further, since no base plate is provided, the semiconductor device can be low-profiled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
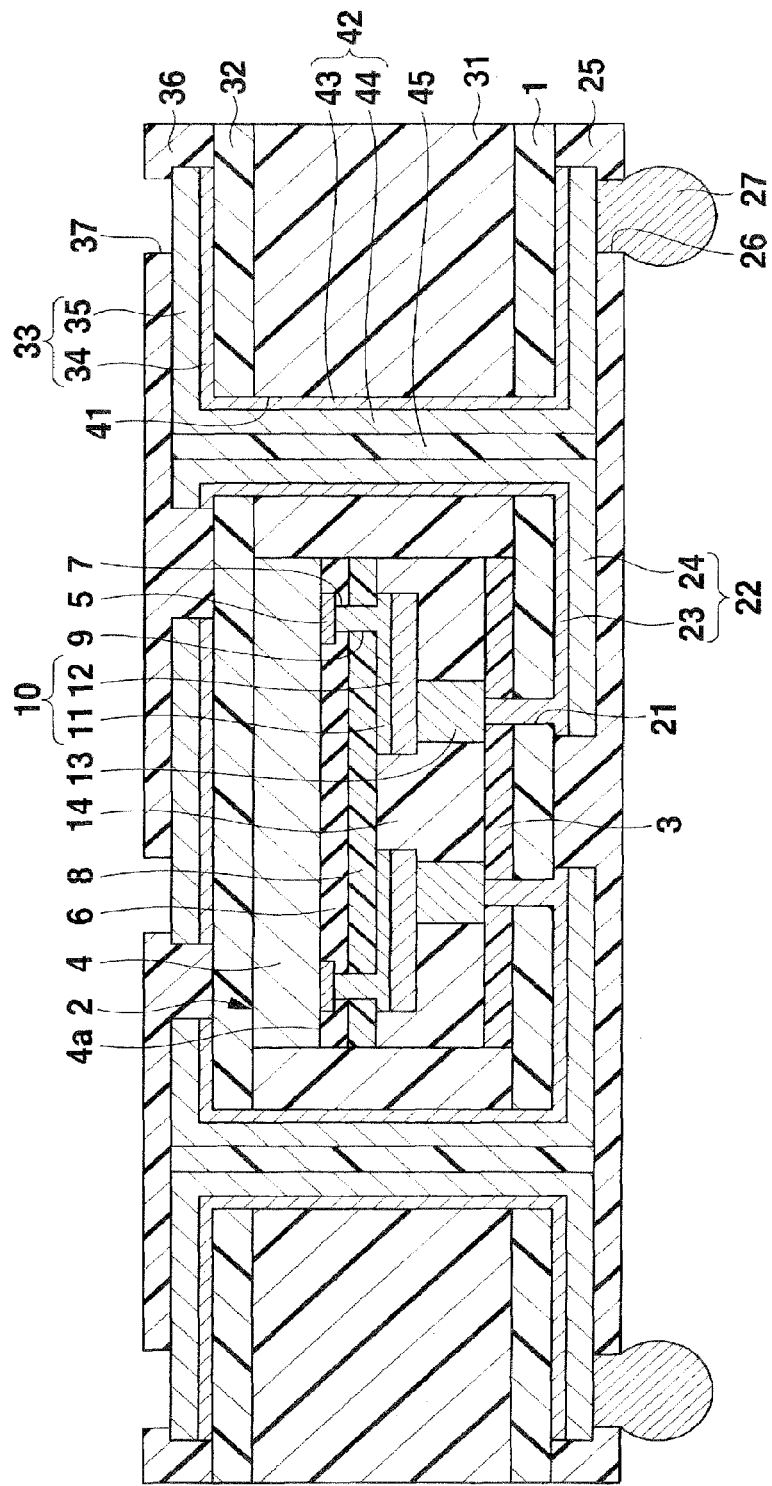
FIG. 1 is a cross-sectional view of a semiconductor device as a first embodiment of the present invention.

FIG. 1 shows a cross-sectional view of a semiconductor device as a first embodiment of the present invention. This semiconductor device includes a lower-layer insulating film 1 of a plane square shape formed by epoxy resin, polyimide resin, glass fabric substrate epoxy resin, and the like. In a center portion of the upper surface of the lower-layer insulating film 1, a semiconductor constituent 2 is mounted via an adhesive layer 3 composed of epoxy resin, etc. In such event, the plane size of the lower layer insulating film 1 is larger than the plane size of the semiconductor constituent 2.

The semiconductor constituent 2 is equipped with a silicon substrate (semiconductor substrate) 4 of a plane square shape. On the bottom surface 4a of the silicon substrate 4, an integrated circuit (not illustrated) of a predetermined function is equipped, and in peripheral portions of the lower surface, a plurality of connection pads 5 made of aluminum-based metal or the like are electrically connected to the integrated circuit. An insulating film 6 composed of silicon oxide or the like is provided on the lower surface of the connection pads 5 excluding the center portion of the connection pads 5 and on the lower surface of the silicon substrate 4, and a center portion of the connection pads 5 is exposed via an opening 7 provided in the insulating film 6.

A passivation film 8 composed of polyimide resin, and the like is provided on the lower surface of the insulating film 6. An opening or through hole 9 is provided in the passivation film 8 at the portion corresponding to the opening 7 of the insulating film 6. A plurality of wirings 10 are provided on the lower surface of the passivation film 8. Each wiring 10 has a two-layer structure of a metallic underlayer 11 made of copper provided on the lower surface of the passivation film 8 and a metallic upperlayer 12 made of copper provided on the lower surface of the metallic underlayer 11. One end of each of the wirings 10 is electrically connected to the connection pad 5 via the opening 7 of the insulating film 6 and opening 9 of the passivation film 8.

On the other end of each of the wirings 10, a columnar electrode (electrode for external connection) 13 made of copper is provided. On the lower surfaces of the passivation film 8 and the wirings 10, a sealing film 14 made of epoxy resin, or the like is provided in such a manner that the lower surface thereof is flush with the lower surfaces of the columnar electrodes 13. The semiconductor constituent 2 of this kind of configuration is mounted on the upper surface center portion of the lower layer insulating film 1 by bonding the lower surfaces of the columnar electrodes 13 and the sealing film 14 to the upper surface center portion of the lower layer insulating film 1 via the adhesive layer 3 made of epoxy resin or the like.

A plurality of openings or through holes 21 are formed in the underlayer insulating film 1 and the adhesive layer 3 in the portions corresponding to the lower surface center portions of the columnar electrodes 13 of the semiconductor constituent 2. A plurality of lower layer wirings 22 are provided on the lower surface of the lower layer insulating film 1. Each of the lower layer wirings 22 has a two-layer structure of a metallic underlayer 23 made of copper provided on the lower surface of the insulating film 1 and an metallic upperlayer 24 made of copper provided on the lower surface of the metallic underlayer 23. One end portion of each of the lower layer wirings 22 is connected to the columnar electrode 13 of the semiconductor constituent 2 via the openings of the lower layer insulating film 1 and the adhesive layer 3.

A lower layer overcoat film 25 made of solder resist or the like is provided on the lower surfaces of the lower layer wirings 22 and the lower layer insulating film 1. A plurality of openings 26 are formed in the lower layer overcoat film 25 in the portions that correspond to the other end portions or the connection pad portions of the lower layer wirings 22. To the inside and the lower side of the openings 26 of the lower layer overcoat film 25, a plurality of solder balls 27 are provided by being connected to the connection pad portions of the lower layer wirings 22.

An insulation layer 31 is provided on the upper surface of the lower layer insulating film 1 around the periphery of the adhesive layer 3 and the semiconductor constituent 2. The insulation layer 31 is composed of epoxy resin, polyimide resin, glass fabric substrate epoxy resin, or the like. On the upper surface of the semiconductor constituent 2 and the insulation layer 31, an upper layer insulating film 32 made of the same material as that of the lower layer insulating film 1 is provided.

A plurality of upper-layer wirings 33 are provided on the upper surface of the upper layer insulating film 32. Each upper-layer wiring 33 is made of a two-layer structure of a metallic underlayer 34 made of copper provided on the upper surface of the upper-layer insulating film 32 and a metallic upperlayer 35 made of copper provided to the upper surface of the metallic underlayer 34. An upper-layer overcoat film 36 made of solder resist or the like is provided on the upper surface of the upper-layer wirings 33 and the upper-layer insulating film 32. A plurality of openings 37 are formed in the upper-layer overcoat film 36 in the portions that correspond to the connection pads of the upper-layer wirings 33.

The lower layer wirings 22 and the upper layer wirings 33 are electrically connected via cylindrical vertical conducting units 42 provided on inner wall surfaces of through holes 41 provided at predetermined locations of the lower-layer insulating film 1, insulation layer 31, and upper-layer insulating film 32. Each of the vertical conducting units 42 has a two-layer structure of a metallic underlayer 43 made of copper directly provided on the inner wall surface of the through hole 41 and a metallic upperlayer 44 made of copper provided on the inner surface of the metallic underlayer 43. A packing material 45 made of solder resist or the like is filled in the center throughhole of the vertical conducting unit 42.

Figure 2:
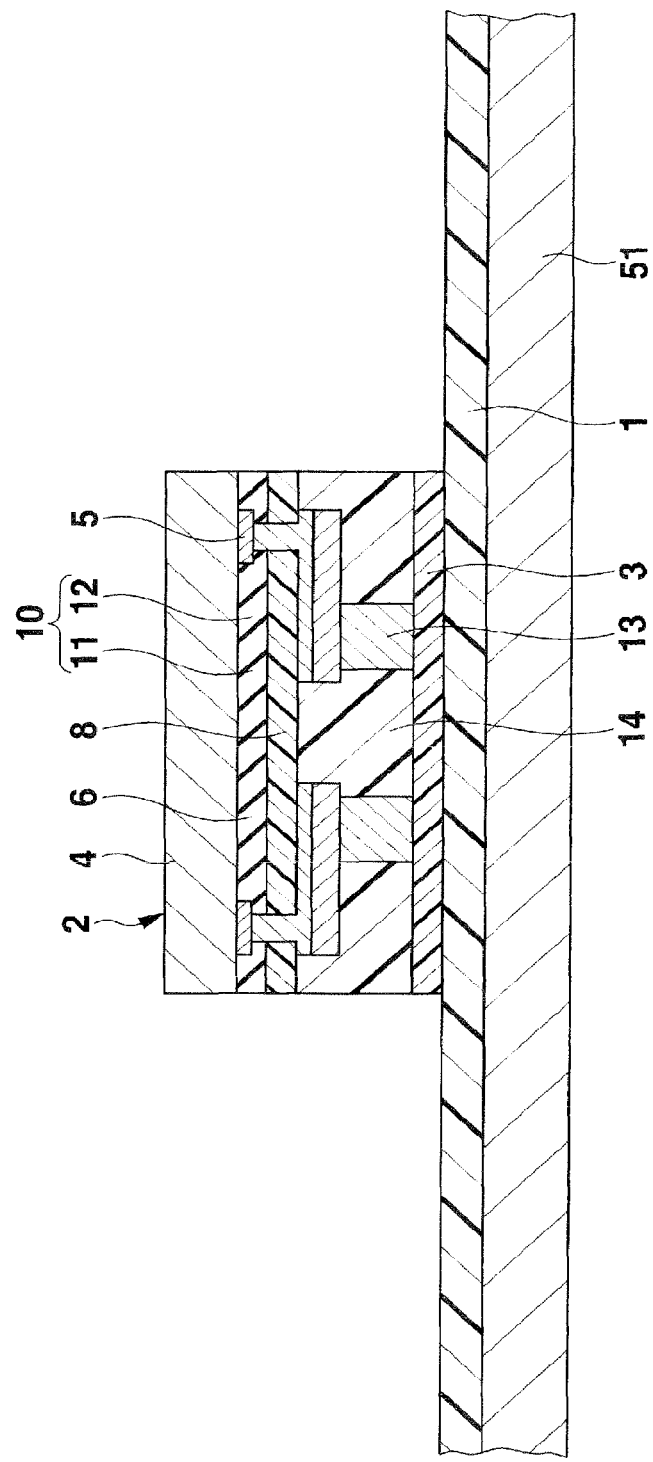
FIG. 2 is a cross-sectional view of an initial step in one example of a method for manufacturing the semiconductor device shown in FIG. 1.

Next discussion will be made on one example of the method for manufacturing this semiconductor device. First of all, as shown in FIG. 2, a base plate 51 made of copper foil is prepared, on the upper surface of which the lower layer insulating film 1 composed of epoxy resin, polyimide resin, glass fabric substrate epoxy resin, or the like is formed. In such event, the size of the base plate 51 prepared should be the size that can form a plurality of completed semiconductor devices shown in FIG. 1. In addition, thermosetting resin made of epoxy resin or the like of the lower-layer insulating film 1 has already been hardened.

In addition, the semiconductor constituents 2 are prepared. The semiconductor constituents 2 can be obtained by singulation by dicing after forming integrated circuits (not illustrated), connection pads 5 made of aluminum-based metal or the like, insulating film 6 made of silicon oxide or the like, passivation film 8 made of polyimide resin or the like, wirings 10 (metallic underlayers 11 made of copper and metallic upperlayers 12 made of copper), columnar electrodes 13 made of copper, and sealing film 14 made of epoxy resin, etc. under the silicon substrate 4 in a wafer state.

Then, each of the semiconductor constituents 2 is mounted on the semiconductor constituent mounting area on the upper surface of the lower-layer insulating film 1 by bonding the lower surfaces of the columnar electrodes 13 of the semiconductor constituent 2 and the sealing film 14 via the adhesive layer 3 made of epoxy resin or the like. In such event, to the semiconductor constituent mounting area of the upper surface of the lower-layer insulating film 1, paste-form adhesive called NCP (Non-Conductive Paste) is supplied in advance by the use of a print process, dispenser or the like, or sheet-form adhesive called NCF (Non-Conductive Film) is supplied in advance, and the semiconductor constituent 2 is firmly fixed to the lower-layer insulating film 1 by heat-crimping.

Figure 3:
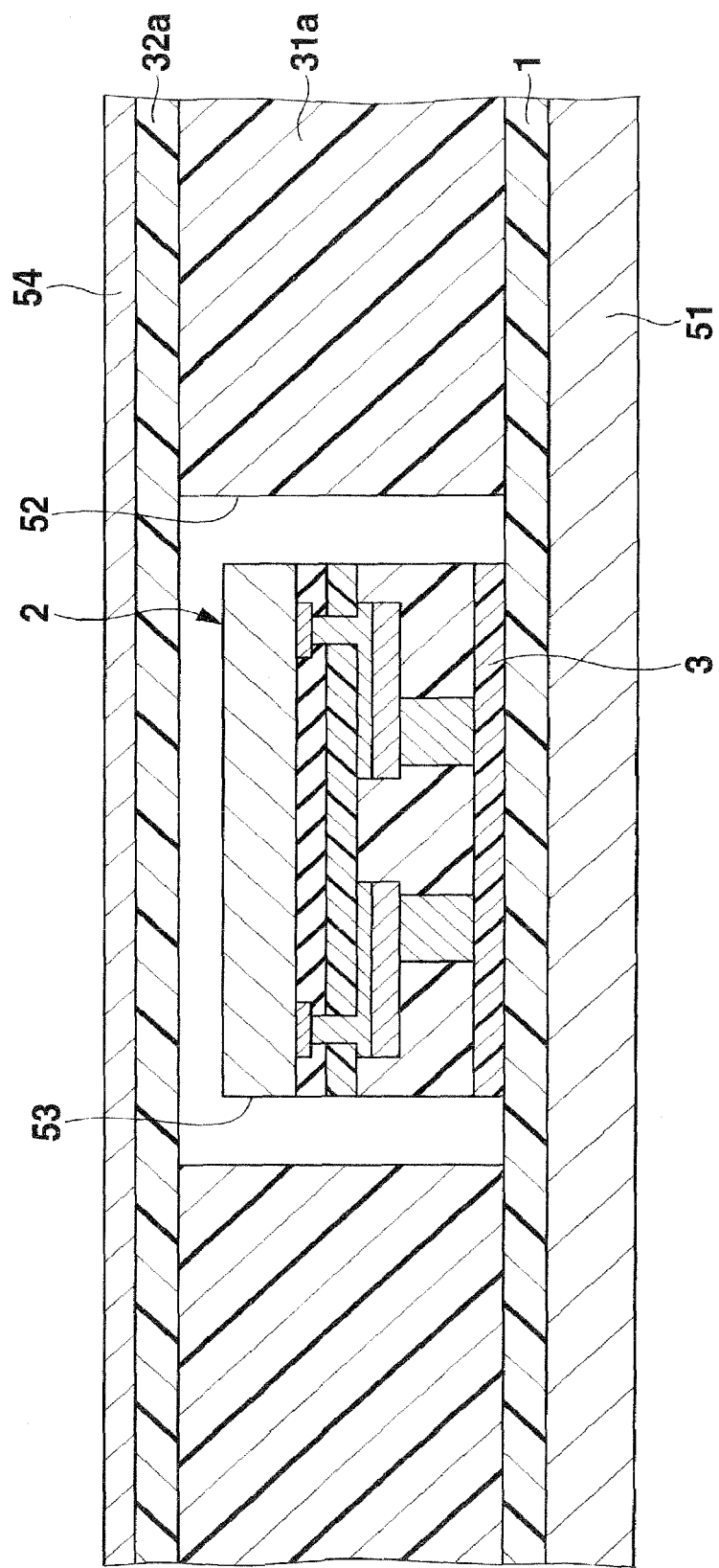
FIG. 3 is a cross-sectional view of a step following FIG. 2.

Next, as shown in FIG. 3, to the upper surface of the lower-layer insulating film 1 in the periphery of the semiconductor constituents 2 and the adhesive layers 3, a lattice-shaped insulation layer forming sheet 31a is sucked by a vacuum suction unit or the like, moved by an XY stage, positioned, and fixed. Fixing is conducted by a method of using, for example, a pin or the like to pierce through the insulation layer forming sheet 31a into the lower-layer insulating film 1 at the edge of the sheet 31a. The insulation layer forming sheet 31a is formed by impregnating thermosetting resin made of epoxy resin or the like into the substrate formed by glass fabric or the like, making a sheet form by bringing the thermosetting resin into the semi-hardened state, and a plurality of square-shaped openings 52 are formed by punching or the like. The size of each of the openings 52 in the sheet 31a is slightly larger than the size of the corresponding semiconductor constituent 2. Consequently, a clearance 53 is formed between each square frame portion of the insulation layer forming sheet 31a and the semiconductor constituent 2.

Then, on the upper surface of the insulation layer forming sheet 31a, a sub-base plate 54 made of copper foil is disposed, on the lower surface of which an upper layer insulating film forming layer 32a has been formed. The upper-layer insulating film forming layer 32a is made of the same material as that of the lower-layer insulating film 1, and of the material, the thermosetting resin made of epoxy resin or the like is brought into the semi-hardened state.

Figure 4:
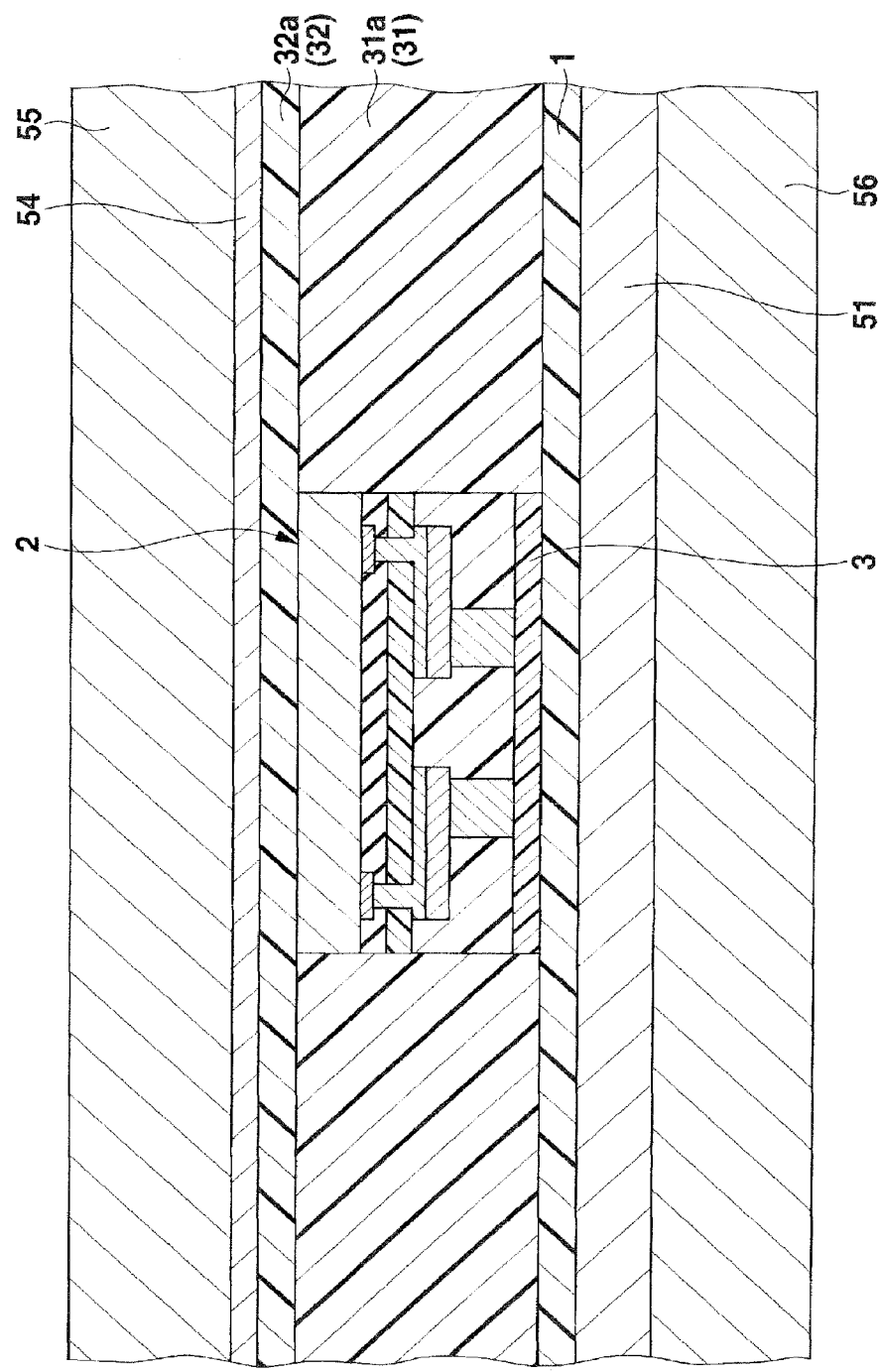
FIG. 4 is a cross-sectional view of a step following FIG. 3.

Next, as shown in FIG. 4, using a pair of hot pressing plates 55 and 56, the insulation layer forming sheet 31a and upper-layer insulating film forming layer 32a are hot-pressed from top and bottom. By this hot-pressing, the sheet 31a is compressed and the thermosetting resin of the sheet 31a and the layer 32a are fluidized and filled into the clearance 53 shown in FIG. 3. Then, it is solidified by cooling, and the insulation layer 31 is formed on the upper surface of the lower-layer insulating film 1 in the periphery of the semiconductor constituent 2 including the adhesive layer 3, and at the same time, the upper layer insulating film 32 is formed on the upper surfaces of the semiconductor constituents 2 and the insulation layer 31.

In such event, the thermosetting resin of the lower-layer insulating film 1 is hardened in advance and the film 1 is therefore scarcely deformed by heat or pressure. In addition, by the sub-base plate 54, it is possible to prevent thermosetting resin constituting the upper-layer insulating film forming layer 32a from unnecessarily adhering to the lower surface of the hot-pressing plate 55 on the upper side. As a result, the hot-pressing plate 55 can be reused as it is.

Figure 5:
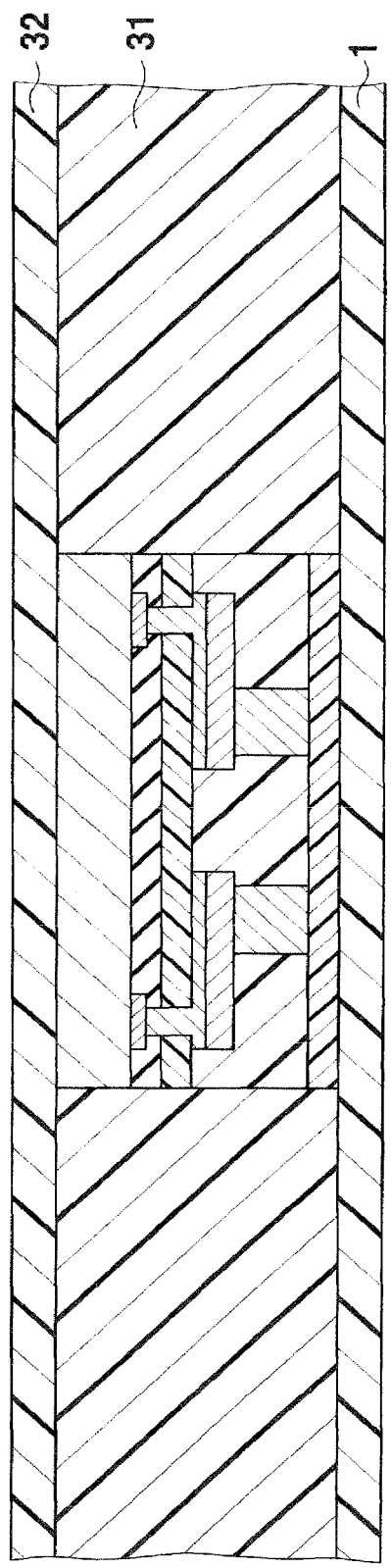
FIG. 5 is a cross-sectional view of a step following FIG. 4.

Then, removing the base plate 51 and the sub-base plate 54 by the use of an etchant exposes the lower surface of the lower-layer insulating film 1 as shown in FIG. 5 and at the same time, exposes the upper surface of the upper-layer insulating film 32. Under this condition, even if the base plate 51 and the sub-base plate 54 are removed, strength can be sufficiently secured by the presence of the lower-layer insulating film 1, insulation layer 31 and upper-layer insulating film 32.

Figure 6:
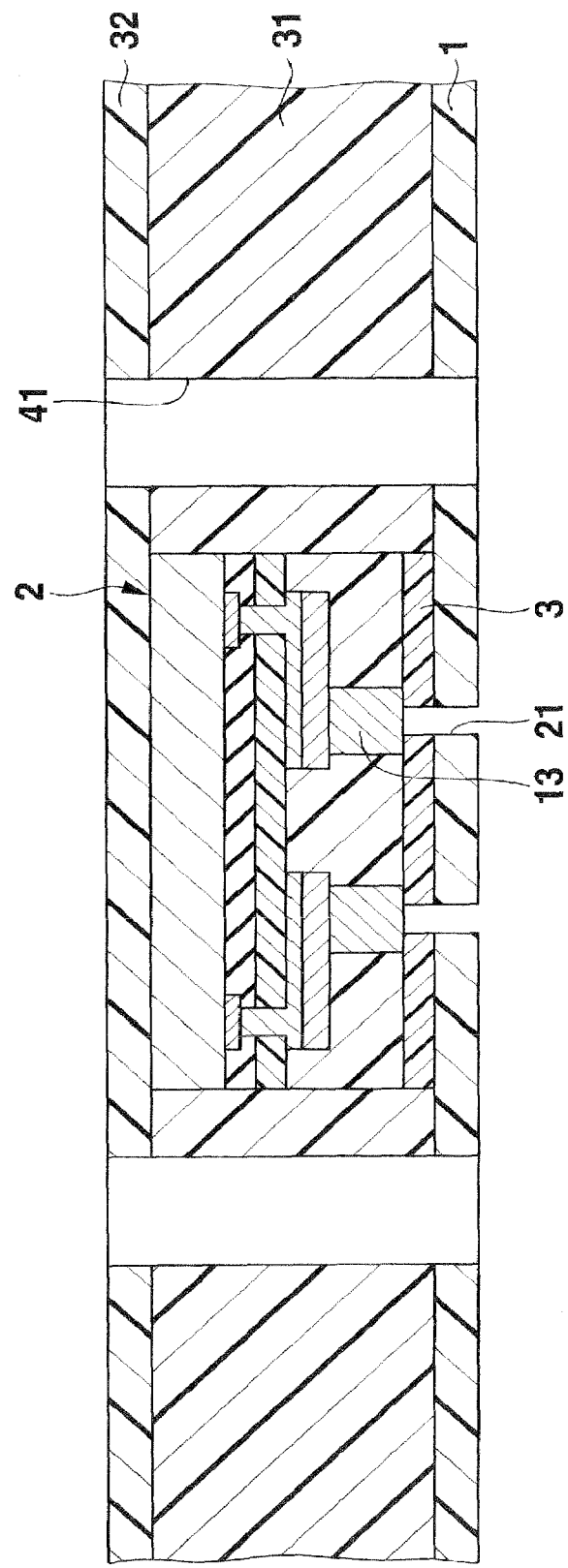
FIG. 6 is a cross-sectional view of a step following FIG. 5.

Then, as shown in FIG. 6, the openings 21 are formed by laser processing, which irradiates the lower-layer insulating film 1 and the adhesive layer 3 in the portions corresponding to the lower-surface center portions of the columnar electrodes 13 of the semiconductor constituent 2 with laser beam. In addition, the throughholes 41 are formed by the use of a mechanical drill in predetermined places of the lower-layer insulating film 1, insulation layer 31, and upper-layer insulating film 32.

Figure 7:
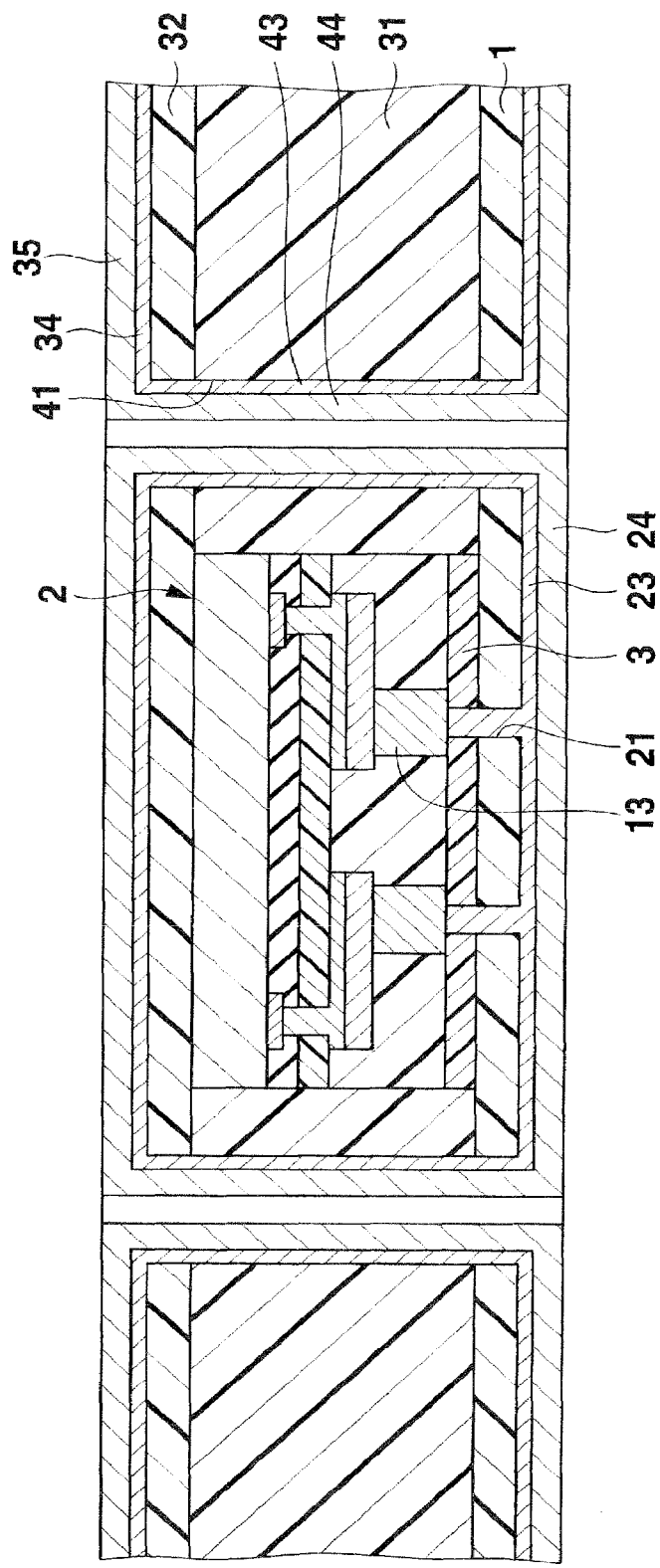
FIG. 7 is a cross-sectional view of a step following FIG. 6.

As shown in FIG. 7, on the lower surfaces of the columnar electrodes 13 of the semiconductor constituents 2 exposed via the openings 21 of the lower-layer insulating film 1 and adhesive layer 3 and the whole lower surface of the lower-layer insulating film 1, as well as on the whole upper surface of the upper-layer insulating film 32 and the inner wall surfaces of throughholes 41, metallic underlayers 23, 34, and 43 are formed by copper electroless plating. The metallic underlayers 23, 34, and 43 are integral with one another so that they are electrically connected. Then, by performing copper electrolytic plating with the metallic underlayers 23, 34, and 43 used as plating current paths, metallic upperlayers 24, 35, and 44 are formed on the surfaces of metallic underlayers 23, 34, and 43.

Figure 8:
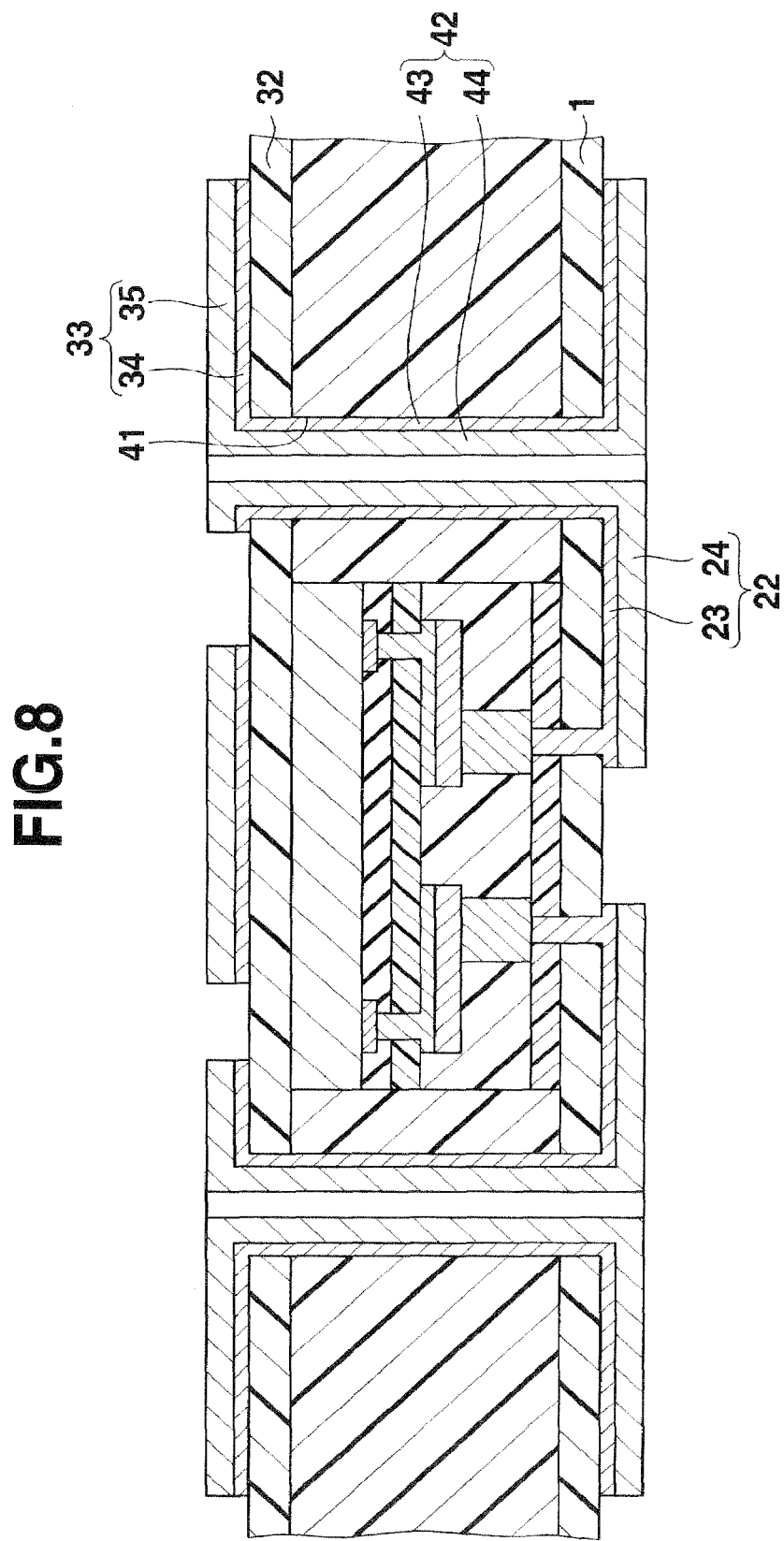
FIG. 8 is a cross-sectional view of a step following FIG. 7.

Next, patterning the metallic upperlayers or inner layers 24 and 35 and metallic underlayers or outer layers 23 and 34 by photolithography results in the condition shown in FIG. 8. That is, the lower-layer wirings 22 of a two-layer structure composed of the laminated metallic underlayers 23, 24 are formed on the lower surface of the lower-layer insulating film 1. In addition, upper-layer wirings 33 of a two-layer structure composed of the laminated underlayers 34, 35 are formed on the upper surface of the upper-layer insulating film 32. Furthermore, a vertical conducting unit 42 of a two-layer structure composed of the metallic underlayer 43 and the metallic upperlayer 44 is formed on the inner wall surface of throughhole 41.

Figure 9:
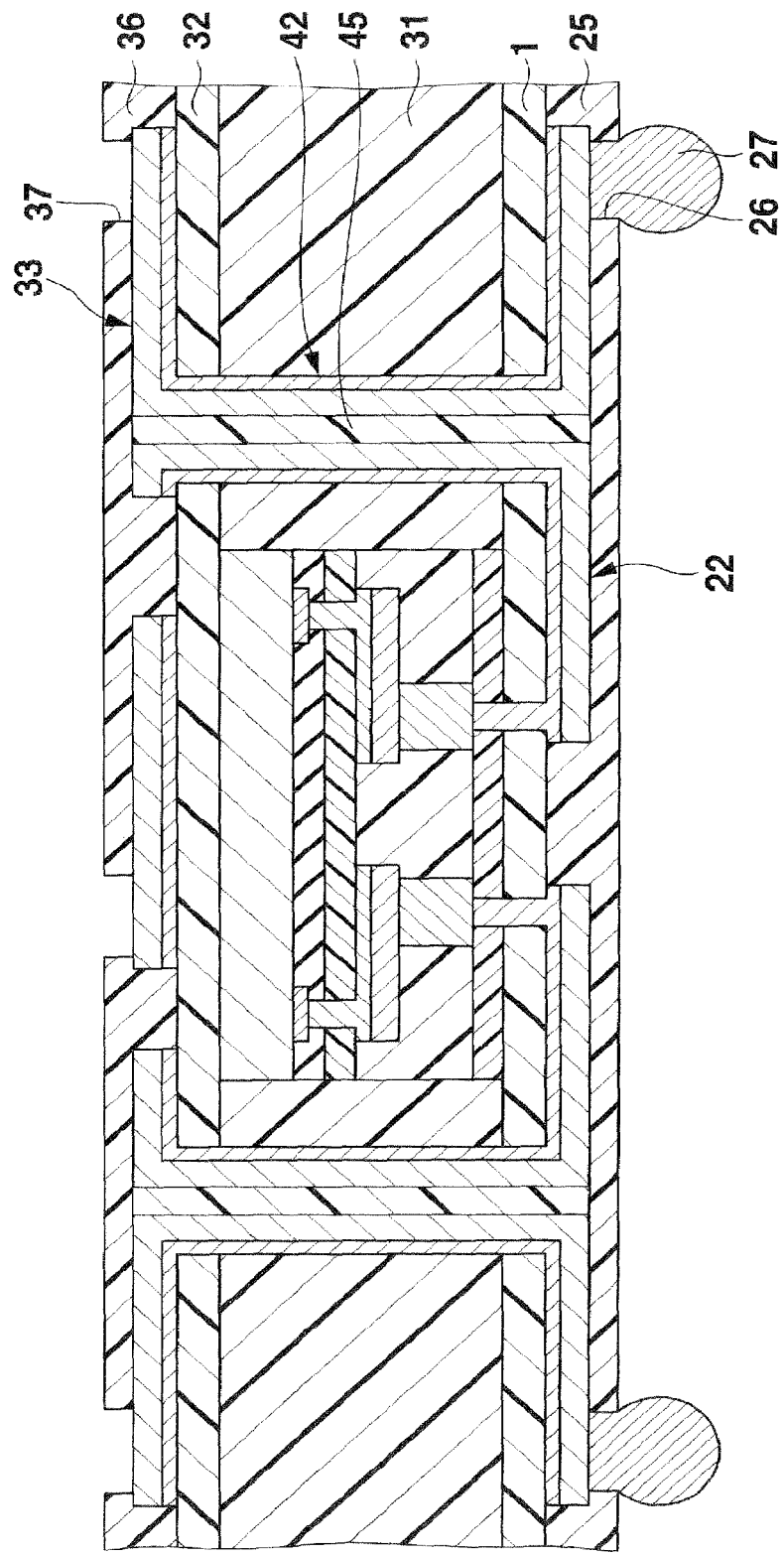
FIG. 9 is a cross-sectional view of a step following FIG. 8.

Next, as shown in FIG. 9, a lower-layer overcoat film 25 made of solder resist or the like is formed on the lower surface of the lower-layer insulating film 1 and the lower-layer wirings 22 by screen print process, spin-coat method, or the like. In addition, on the upper surface of the upper-layer insulating film 32 and the upper-layer wirings 33, the upper-layer overcoat film 36 made of solder resist or the like is formed by screen print process, spin-coat method, or the like. Under this condition, the inside of the vertical conducting unit 42 is filled with the packing material 45 made of solder resist or the like.

Next, the openings 26 are formed in the lower-layer overcoat film 25 at the portions corresponding to the connection pads of the lower-layer wirings 22, by laser processing for irradiating the film with laser beam. In addition, on the upper-layer overcoat film 36 at the portions corresponding to the connection pads of the upper-layer wirings 33, the openings 37 are formed by laser processing for irradiating the film with laser beam.

Next, inside and on the lower side of each of the openings 26 of the lower-layer overcoat film 25, the solder ball (solder layer) 27 is provided to be connected with the connection pad of the lower-layer wiring 22. Then, between semiconductor constituents 2 adjacent to each other, cutting the lower-layer overcoat film 25, lower-layer insulating film 1, insulation layer 31, upper-layer insulating film 32 and the upper-layer overcoat film 36 can produce a plurality of semiconductor devices shown in FIG. 1.

In the semiconductor device obtained in this way, the lower-layer wirings 22 are provided to be connected with the columnar electrodes 13 of the semiconductor constituent 2 under the lower-layer insulating film 1 provided under and around the semiconductor constituent 2. Therefore, the area for arranging solder balls (electrodes for external connection) 27 can be made larger than the plane size of the semiconductor constituent 2 and furthermore, since no base plate 51 is equipped, the semiconductor devices can be low-profiled. Note that, the base plate 51 may be formed of aluminum and other metals.

(Modified Example of the First Embodiment)

Figure 10:
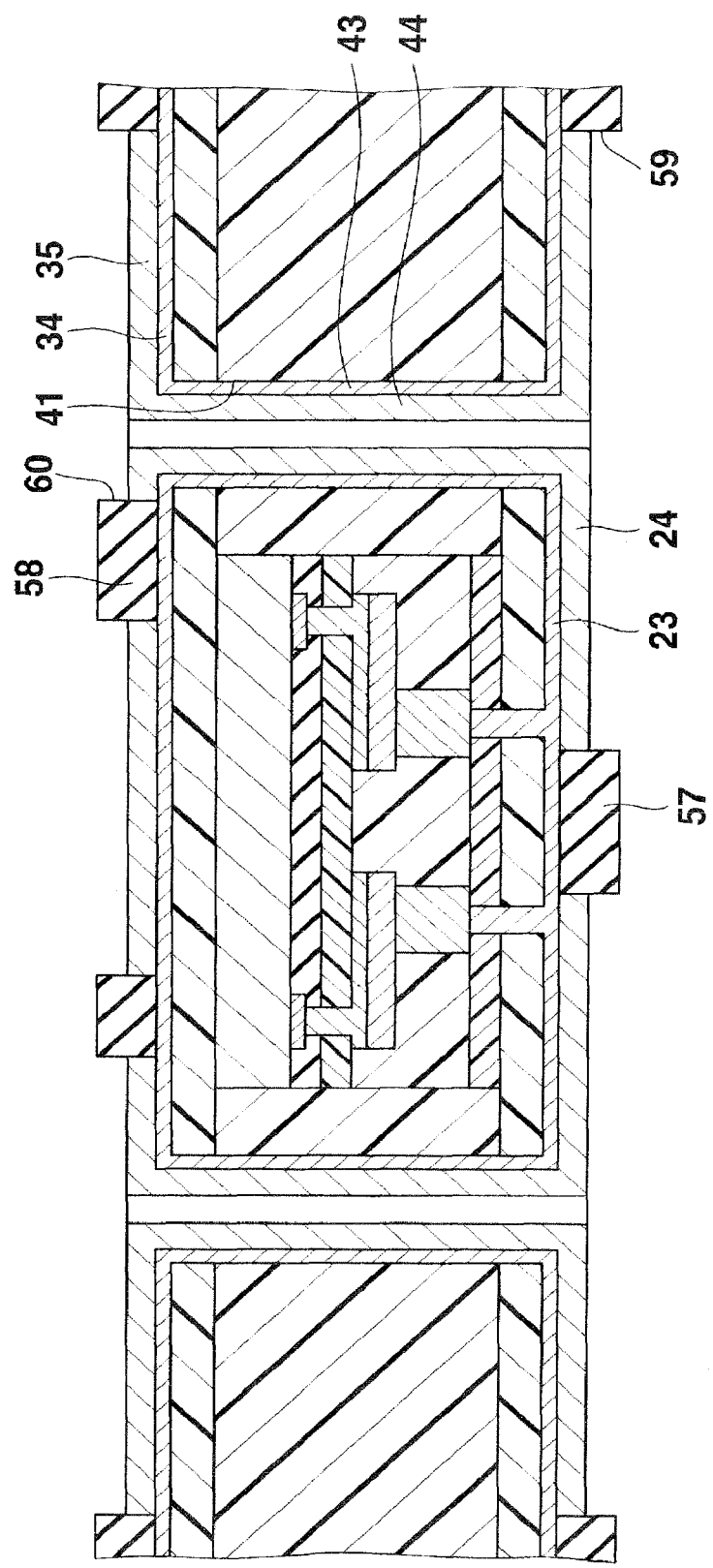
FIG. 10 is a cross-cross-sectional view shown to explain a predetermined step in another example of the method for manufacturing the semiconductor device shown in FIG. 1.

Note that, in the step shown in FIG. 7, after forming the metallic underlayers 23, 34, and 43, the condition as shown in FIG. 10 may be achieved. That is, on the lower surface of the metallic underlayer 23 and the upper surface of the metallic underlayer 34, plated resist films 57 and 58 are respectively formed by patterning. In such event, an opening 59 is formed in the plated resist film 57 at the portion corresponding to the metallic upperlayer 24 forming area including throughhole 41. In addition, an opening 60 is formed in the plated resist film 58 at the portion corresponding to the metallic upperlayer 35 forming area including throughhole 41.

Next, by performing copper electrolytic plating with the metallic underlayers 23, 34, and 43 used as plating current paths, the metallic upperlayer 24 is formed on the lower surface of the metallic underlayer 23 in the openings 59 of the plated resist film 57, and the metallic upperlayer 35 is formed on the upper surface of the metallic underlayer 34 inside the openings 60 of the plated resist film 58, and furthermore, the metallic upperlayer 44 is formed on the inner surface of the metallic underlayer 43 inside the throughholes 41.

Next, the plated resist films 57 and 58 are removed, and then the unwanted portions of the metallic underlayers 23 and 34 are etched away and removed with the metallic upperlayers 24 and 35 used as a mask. Then, as shown in FIG. 8, the metallic underlayer 23 remains only on the metallic upperlayer 24, and the metallic underlayer 34 remains only under the metallic upperlayer 35. In addition, under this condition, the vertical conducting unit 42 of a two-layer structure composed of the metallic underlayer 43 and metallic upperlayer 44 is formed on the inner wall surface of throughhole 41.

(Second Embodiment)

Figure 11:
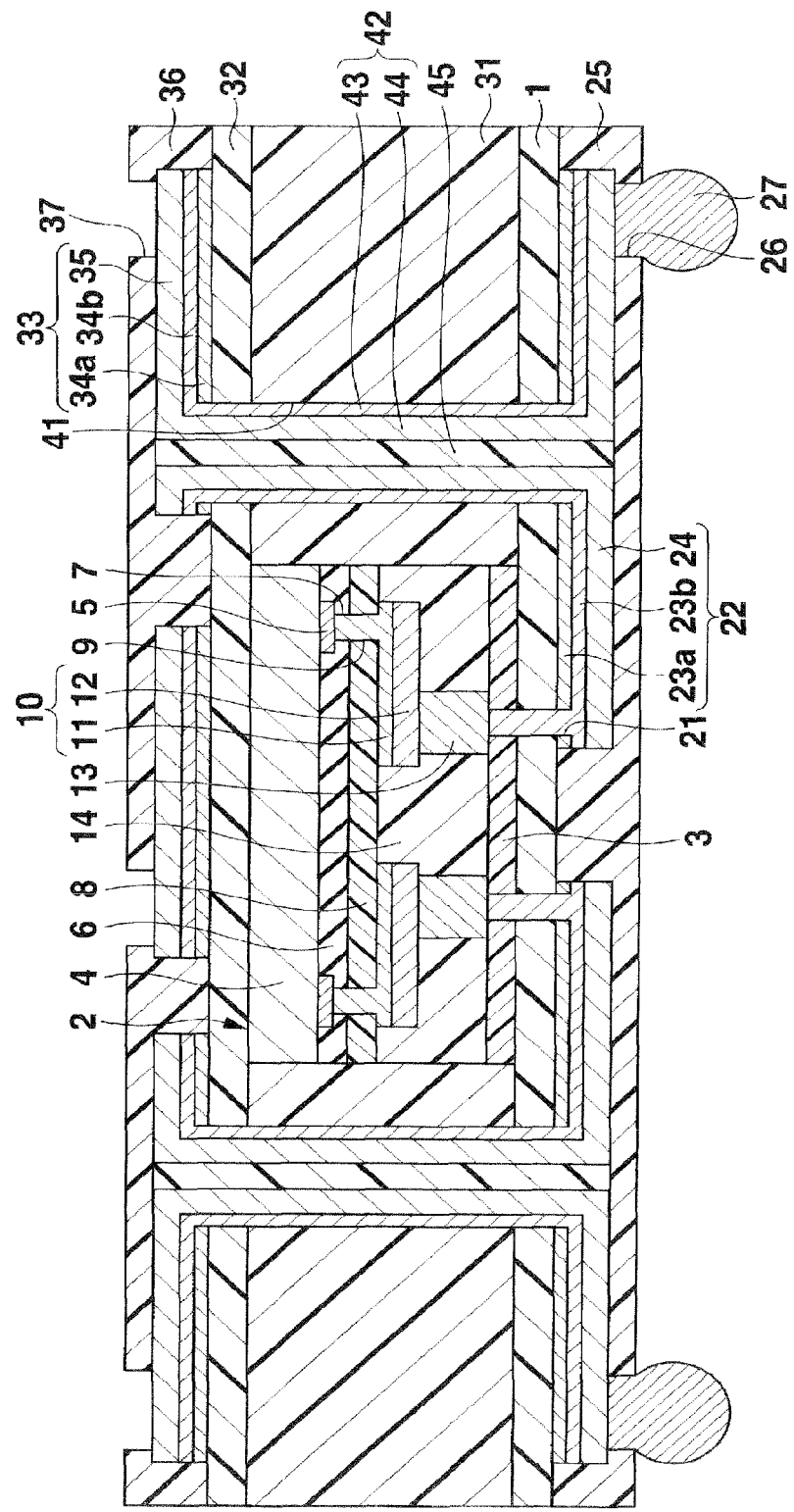
FIG. 11 is a cross-sectional view of a semiconductor device as a second embodiment of the present invention.

FIG. 11 is a cross-sectional view of a semiconductor device as the second embodiment of the present invention. In this semiconductor device, what differs from the semiconductor device shown in FIG. 1 are the lower-layer wirings 22, each of which is formed into a three-layer structure of a first metallic underlayer (lower-layer metallic underlayer) 23a made of copper, a second metallic underlayer (another lower-layer metallic underlayer) 23b made of copper, and the metallic upperlayer (lower-layer metallic upperlayer) 24 made of copper, and the upper-layer wirings 33, each of which is made into three-layer structure of a first metallic underlayer (upper-layer metallic underlayer) 34a made of copper, a second metallic underlayer (other upper-layer metallic underlayer) 34b made of copper, and the metallic upperlayer (upper-layer metallic upperlayer) 35 made of copper. In such event, the openings 21 are formed in the first metallic underlayers 23a, lower-layer insulating film 1, and adhesive layer 3 in the portions that correspond to the lower-surface center portions of the columnar electrodes 13 of the semiconductor constituent 2.

Figure 12:
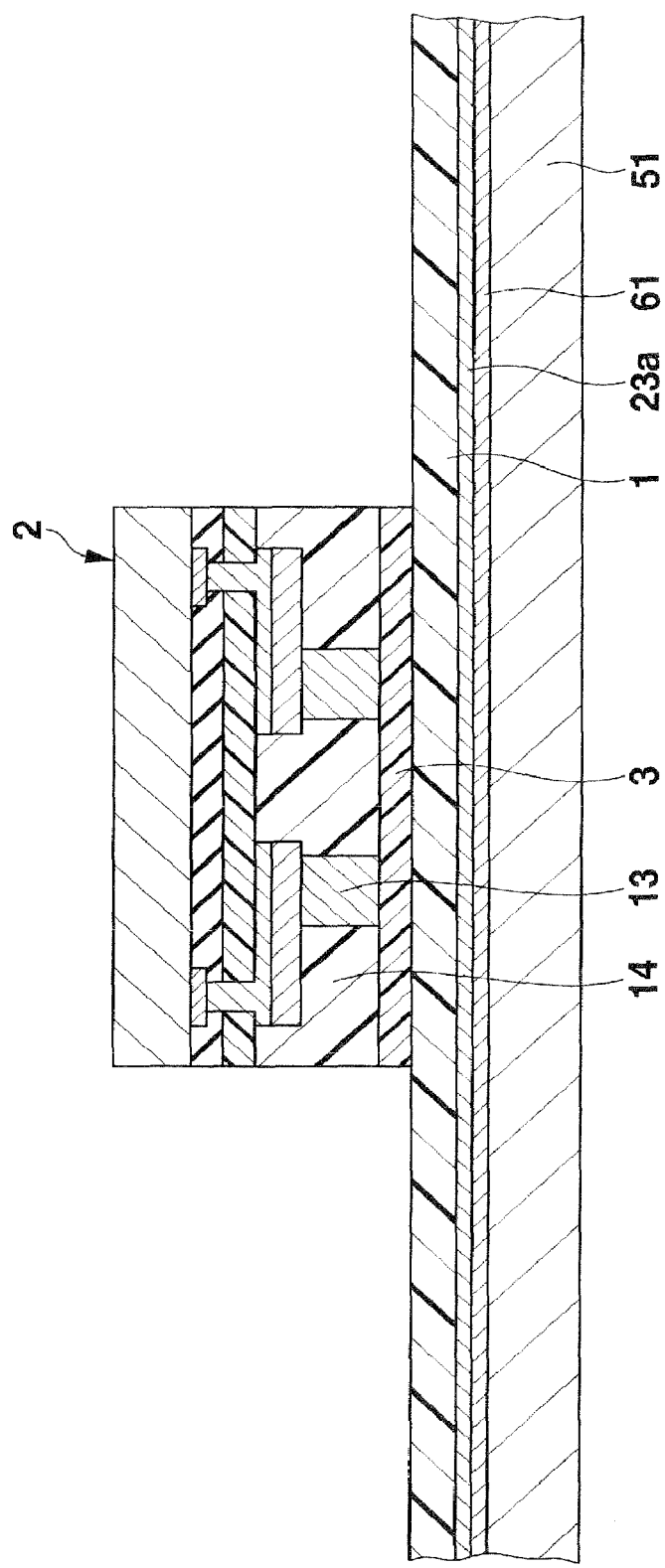
FIG. 12 is a cross-sectional view of an initial step in one example of a method for manufacturing the semiconductor device shown in FIG. 11.

Now, one example of a method for manufacturing this semiconductor device will be described. First of all, as shown in FIG. 12, a substrate or unit is prepared, in which on an upper surface of the base plate 51 made of copper foil, a protection metallic layer (lower-layer protection metallic layer) 61 made of electroless nickel plating, a first metallic underlayer 23a made of electroless copper plating and a lower-layer insulating film 1 made of epoxy resin, polyimide resin, glass fabric substrate epoxy resin, or the like are formed.

Also in such event, the planar size of this prepared substrate is the size that can form a plurality of completed semiconductor devices shown in FIG. 11. In addition, thermosetting resin made of epoxy resin or the like in the lower-layer insulating film 1 has already been hardened. In this event, the upper surface of the first metallic underlayer 23a is roughened by performing surface roughening treatment in advance to increase the adhesion to the lower-layer insulating film 1 composed of the material including resin formed on the upper surface. This is the point which greatly differs from the case of the first embodiment described above. Now, as one example of the surface roughening treatment, a method for immersing the upper surface of the first metallic underlayer 23a in a suitable etchant is mentioned. The surface roughness by the surface roughening treatment can be adjusted by the etchant material. However, the surface roughening treatment shall not be restricted to this method but may be carried out by dry-etching and other methods.

Next, the semiconductor constituents 2 are mounted on the semiconductor constituent mounting areas of the upper surface of the lower-layer insulating film 1 by bonding the lower surfaces of the columnar electrodes 13 and sealing film 14 of the semiconductor constituent 2 via the adhesive layer 3 made of epoxy resin or the like. In such event, using the print method, dispenser or the like, the paste-like adhesive called NCP (Non-Conductive Paste) or sheet-like adhesive called NCF (Non-Conductive Film) is supplied in advance and the semiconductor constituent 2 is firmly fixed to the lower-layer insulating film 1 by hot crimping.

Figure 13:
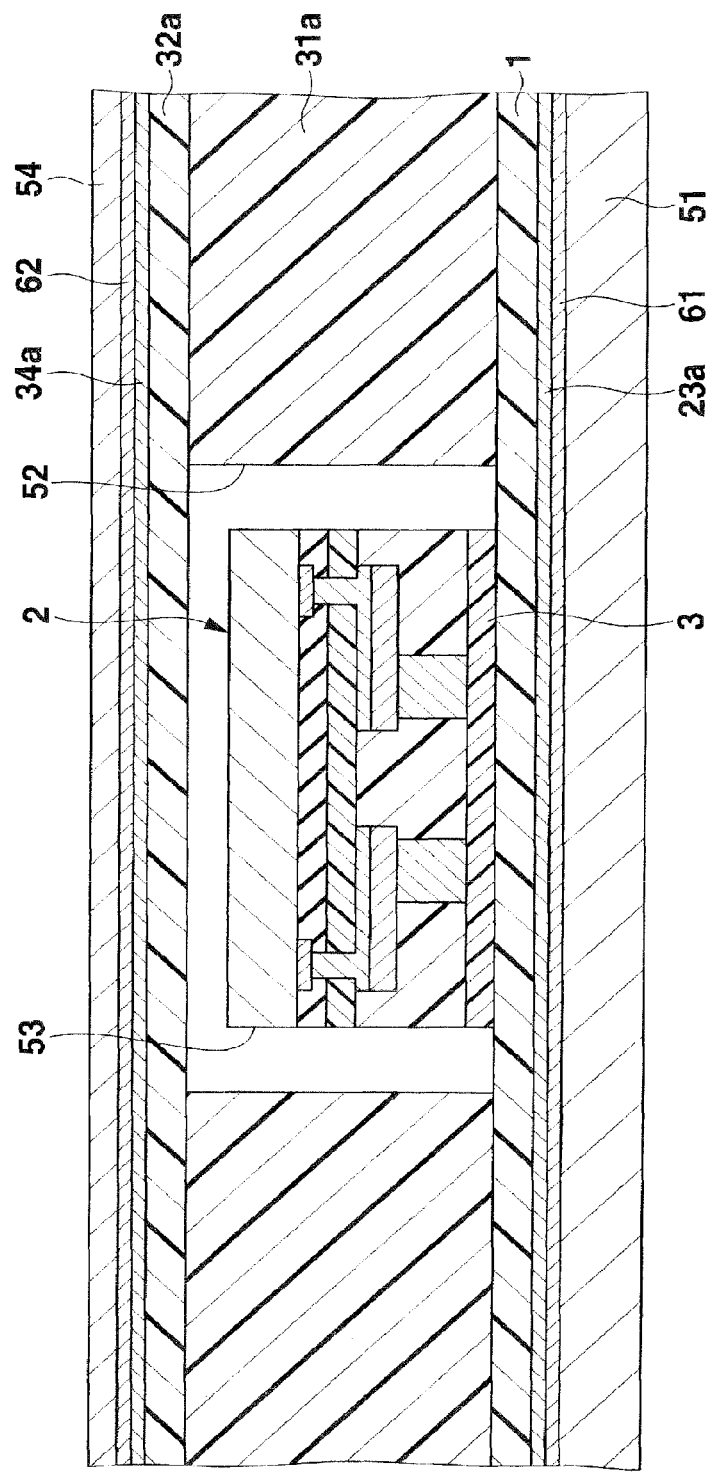
FIG. 13 is a cross-sectional view of a step following FIG. 12.

Next, as shown in FIG. 13, to the upper surface of the lower-layer insulating film 1 in the periphery of the adhesive layers 3 and the semiconductor constituents 2, the lattice-shape insulation layer forming sheet 31a is positioned and fixed with pin or the like. Also in this case, the insulation layer forming sheet 31a is formed by immersing a thermosetting resin composed of epoxy resin or the like in a substrate composed of glass fabric or the like, bringing the thermosetting resin into a semi-hardened state and making it into a sheet form, and a plurality of square-shaped openings 52 are formed by punching or the like. The planar size of the opening 52 of the insulation layer forming sheet 31a is made to be slightly larger than the size of the semiconductor constituent 2 located therein. The thickness of the sheet 31a is set to be slightly thicker than the semiconductor constituent 2. Consequently, the clearance 53 is formed between the inside of the opening 52 in the sheet 31a and the semiconductor constituent 2.

Next, on the upper surface of the insulation layer forming sheet 31a, the sub-base plate 54 made of copper foil is disposed, on the bottom surface of which a protection metal layer (upper-layer protection metal layer) 62 made of electroless nickel plating, a first metallic underlayer 34a made of electroless copper plating and the upper-layer insulating film forming layer 32a have been formed. Also in such event, the upper-layer insulating film forming layer 32a is made of the same material as that of the lower-layer insulating film 1, of which the thermosetting resin made of epoxy resin or the like is brought to the semi-hardened state. Now, the lower surface of the first metallic underlayer 34a is roughened by performing surface roughening treatment in advance in order to improve adhesion to the upper-layer insulating film 32 composed of the material containing resin formed on the relevant lower surface. This is the point that greatly differs from the case of the first embodiment.

Figure 14:
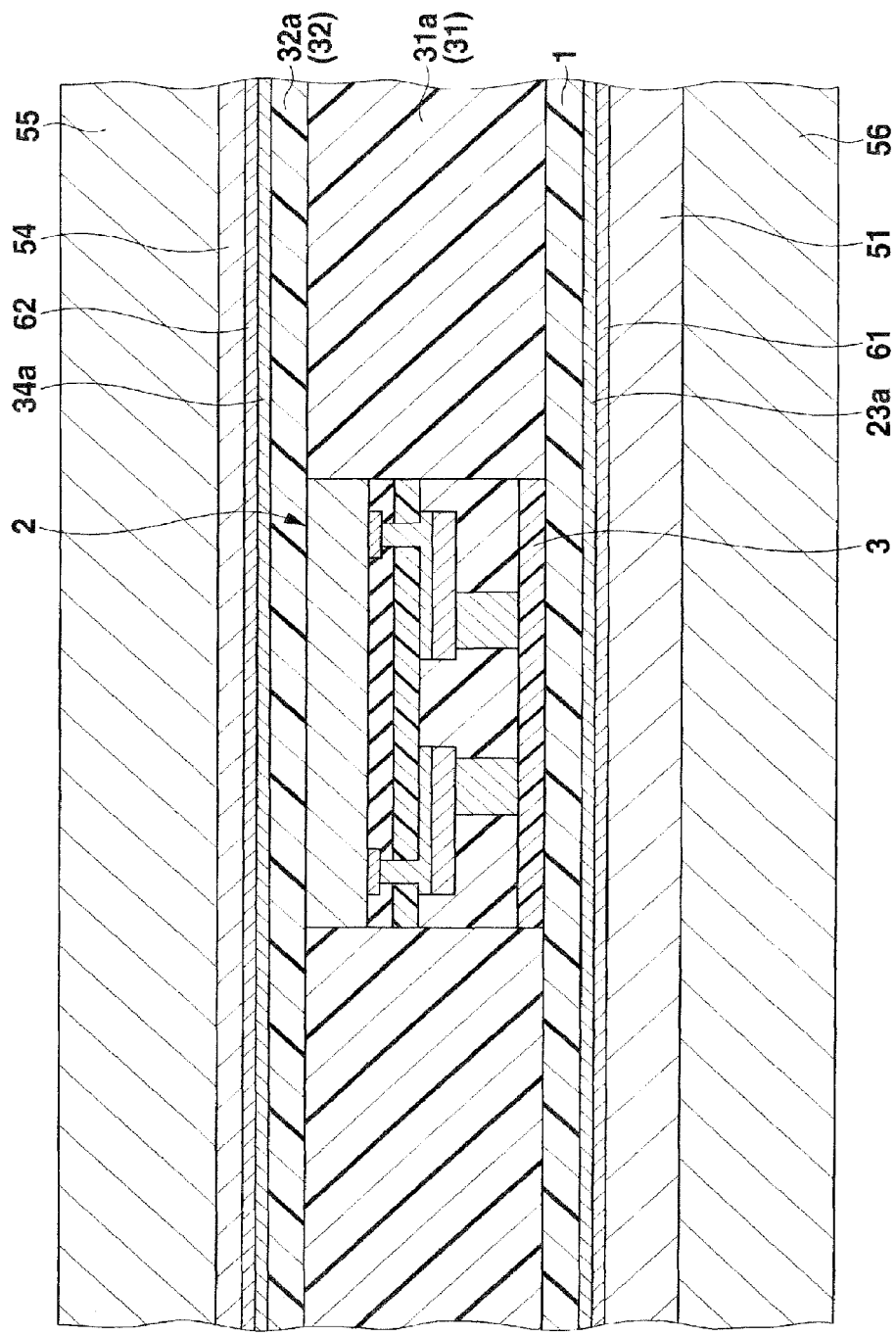
FIG. 14 is a cross-sectional view of a step following FIG. 13.

Next, as shown in FIG. 14, using a pair of hot pressing plates 55 and 56, the insulation layer forming sheet 31a and the upper-layer insulating film forming layer 32a are hot-pressed from top and bottom. By this hot pressing, thermosetting resin in the insulation layer forming sheet 31a and the upper-layer insulating film forming layer 32a is fluidized, filled in the clearance 53 shown in FIG. 13 and a clearance between the upper surface on the semiconductor constituent 2 and the lower surface of the film forming sheet 32a, and solidified by subsequent cooling. Thus, on the lower-layer insulating film 1 in the periphery of the semiconductor constituent 2 and the adhesive layer 3, the insulation layer 31 is formed and at the same time, on the upper surfaces of the semiconductor constituent 2 and the insulation layer 31, the upper-layer insulating film 32 is formed.

Figure 15:
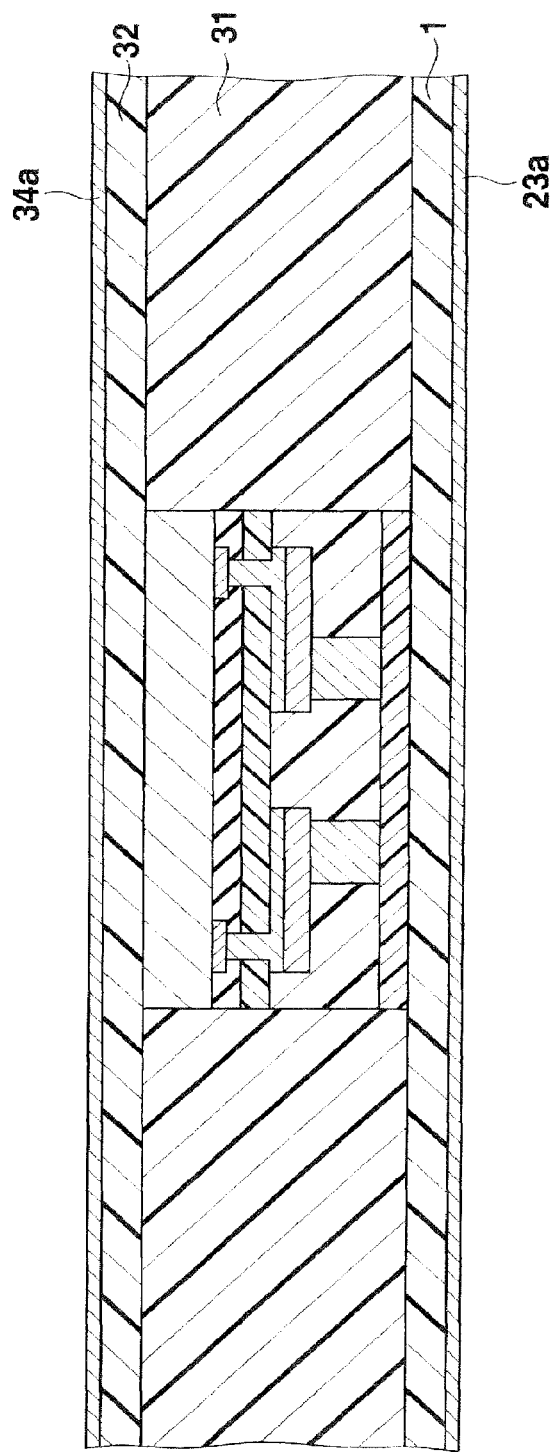
FIG. 15 is a cross-sectional view of a step following FIG. 14.

Next, continuously removing the base plate 51, and protection metal layer 61, as well as sub-base plate 54, and protection metal layer 62 by the use of an etchant exposes the lower surface of the first metallic underlayer 23a, and at the same time, exposes the upper surface of the first metallic underlayer 34a, as shown in FIG. 15. In such event, the protection metal layers 61 and 62 made of nickel are for protecting the first metallic underlayers 23a and 34a made of copper in the same manner from being etched when the base plate 51 and the sub-base plate 54, both made of copper, are removed by the copper etchant. The protection metal layers 61 and 62 are removed by an Ni etchant after removing the base plate 51 and the sub-base plate 54, but also in such event, the first metallic underlayers 23a and 34a made of copper are not etched. Under this condition, the insulation layer 31, upper-layer insulating film 32, and lower-layer insulating film 1 which hermetically seal the semiconductor constituent 2 have been hardened. Therefore, even if the base plate 51, protection metal layer 61, sub-base plate 54, and protection metal layer 62 are removed, strength can be sufficiently secured.

Figure 16:
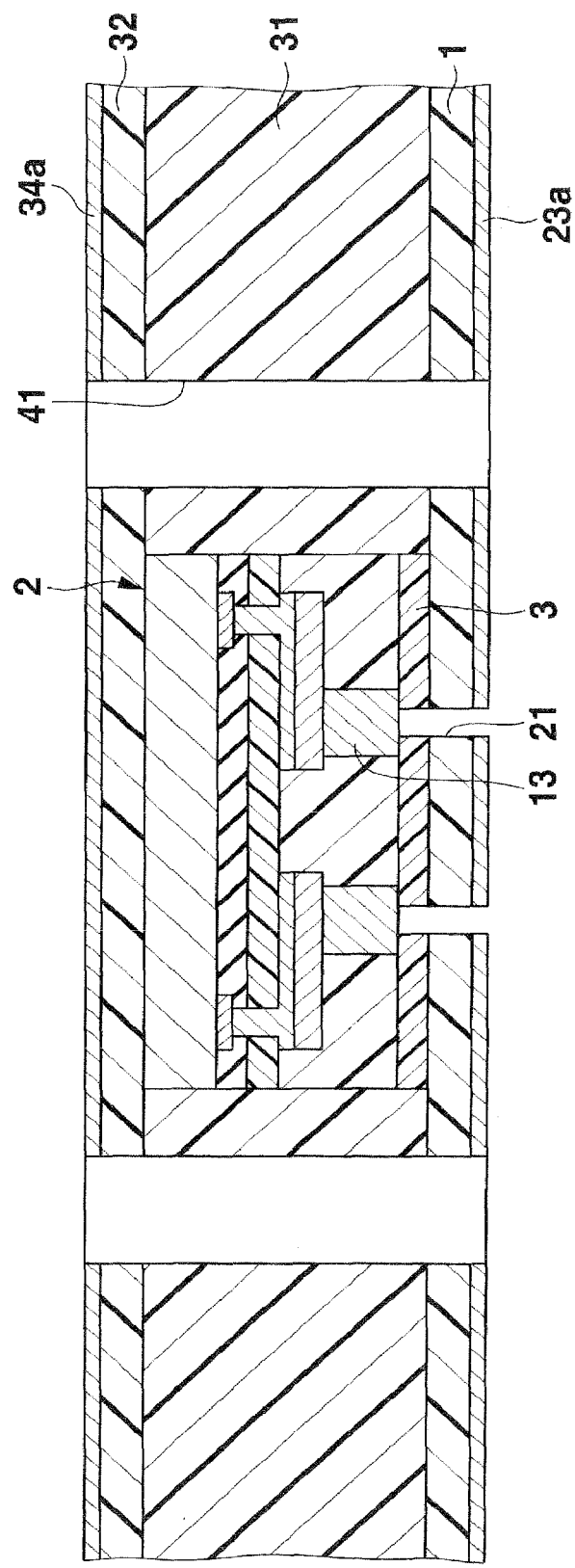
FIG. 16 is a cross-sectional view of a step following FIG. 15.

Next, as shown in FIG. 16, the openings or holes 21 are formed by laser processing, which irradiates the first metallic underlayer 23a, the lower-layer insulating film 1 and the adhesive layers 3 in the portions corresponding to the lower-surface center portions of the columnar electrodes 13 of the semiconductor constituents 2 with laser beam. In addition, through holes 41 are formed by the use of a mechanical drill in predetermined places of the first metallic underlayer 23a, the lower-layer insulating film 1, insulation layer 31, upper-layer insulating film 32, and the first metallic underlayer 34a.

Figure 17:
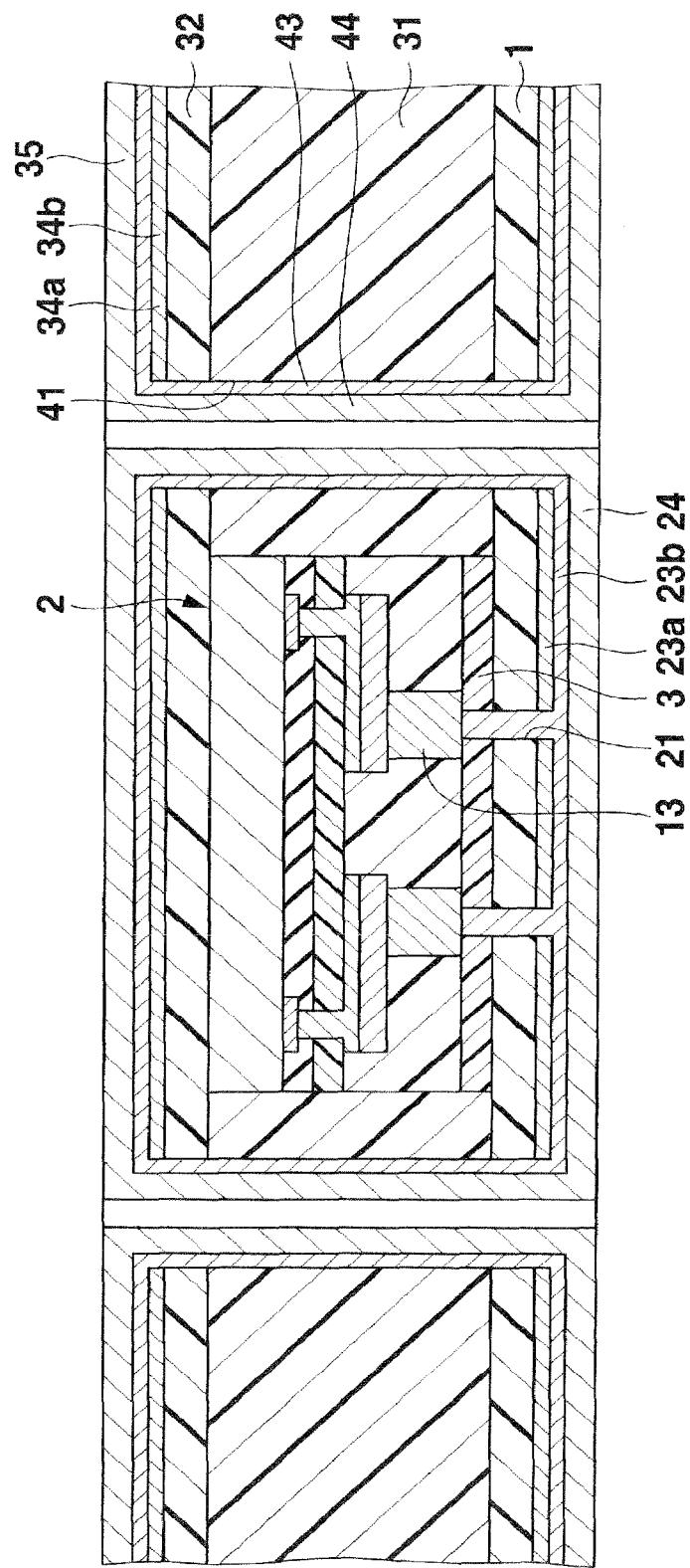
FIG. 17 is a cross-sectional view of a step following FIG. 16.

As shown in FIG. 17, on the whole lower surface of the first metallic underlayer 23a and the lower surfaces of the columnar electrodes 13 of the semiconductor constituent 2 exposed via the openings 21, the whole upper surface of the first metallic underlayer 34a, and the inner wall surface of the through holes 41, metallic underlayers 23b, 34b, and 43 are integrally formed by copper electroless plating.

Then, by performing copper electrolytic plating with the metallic underlayers 23b, 34b, and 43 used as plating current paths, metallic upperlayers 24, 35, and 44 are respectively formed on the surfaces of the metallic underlayers 23b, 34b, and 43.

Figure 18:
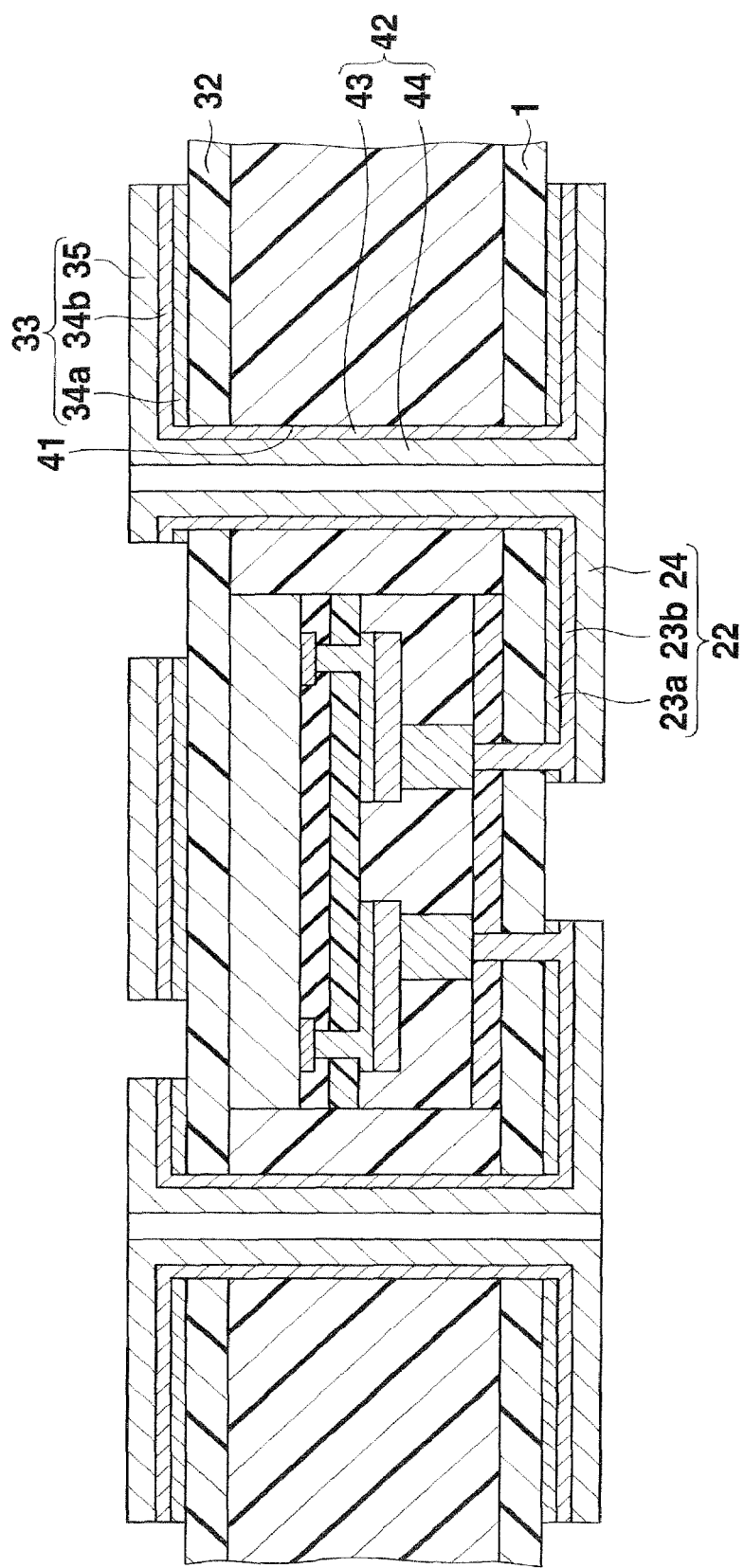
FIG. 18 is a cross-sectional view of a step following FIG. 17.

Next, patterning the metallic upperlayers 24 and 35 and the first and second metallic underlayers 23a, 34a, 23b, and 34b by photolithography results in the condition shown in FIG. 18. That is, on the lower surface of the lower-layer insulating film 1, the lower-layer wirings 22 of three-layer structure each composed of the first and second metallic underlayers 23a and 23b and the metallic upperlayer 24 are formed. In addition, on the upper surface of the upper-layer insulating film 32, upper-layer wirings 33 of three-layer structure each composed of the first and second metallic underlayers 34a and 34b and the metallic upperlayer 35 are formed. Furthermore, on the inner wall surface of each of the through holes 41, a vertical conducting unit 42 of a two-layer structure composed of the metallic underlayer 43 and the metallic upperlayer 44 is formed. Thereafter, undergoing the same process as in the case of the first embodiment can produce a plurality of semiconductor devices shown in FIG. 11.

(Third Embodiment)

Figure 19:
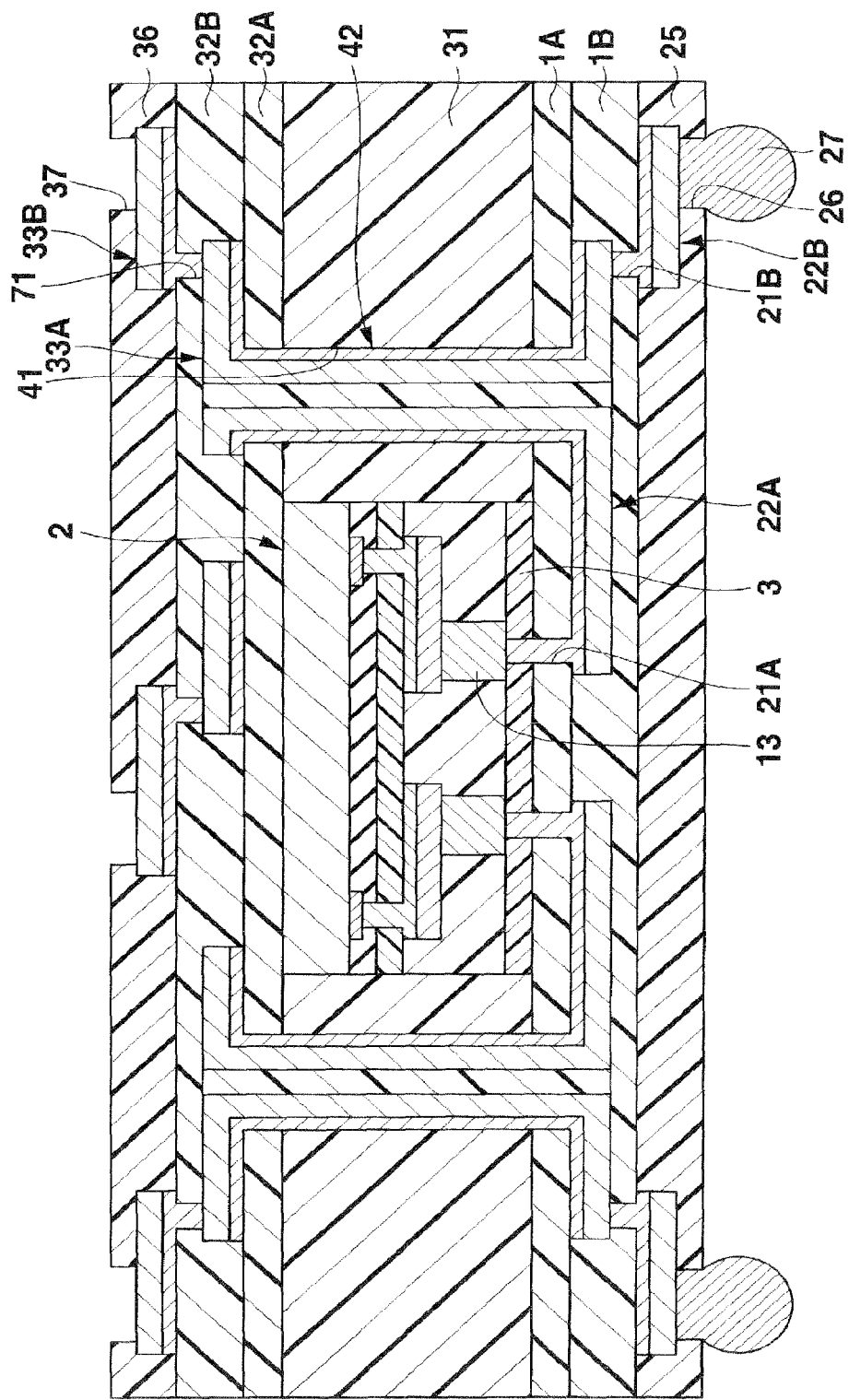
FIG. 19 is a cross-sectional view of a semiconductor device as a third embodiment of the present invention.

FIG. 19 is a cross-sectional view of a semiconductor device as the third embodiment of this invention. What differs from the semiconductor device shown in FIG. 1 in this semiconductor device is the point that the lower-layer wiring and the upper-layer wiring are made into multilayer (two-layer) wiring structure. That is, one end part of a first lower wiring 22A provided on the lower surface of a first lower-layer insulating film 1A is electrically connected to columnar electrode 13 of the semiconductor constituent 2 via an opening 21A provided in the first lower-layer insulating film 1A and the adhesive layer 3. On the lower surface of the first lower-layer insulating film 1A including the first lower layer wiring 22A, a second lower-layer insulating film 1B made of the same material as that of the first lower-layer insulating film 1A is provided.

One end part of a second lower-layer wiring 22B provided on the lower surface of the second lower-layer insulating film 1B is connected to the connection pad of the first lower-layer wiring 22A via the opening 21B provided on the second lower-layer insulating film 1B. On the lower surface of the second lower-layer insulating film 1B and the second lower-layer wirings 22B, the lower-layer overcoat film 25 is provided.

Inside and in the lower part of the opening 26 of the lower-layer overcoat film 25, solder ball 27 is provided to be electrically connected with the connection pad of the second lower-layer wiring 22B.

A plurality of first upper-layer wirings 33A provided on the upper surface of a first upper-layer insulating film 32A are electrically connected to the corresponding first lower-layer wiring a 22A via the vertical conducting units 42. On the upper surfaces of the upper-layer insulating films 32A and the first upper-layer wirings 33A, a second upper-layer insulating film 32B made of the same material as that of the first upper-layer insulating film 32A is provided.

One end part each of a plurality of second upper-layer wirings 33B provided on the upper surface of the second upper-layer insulating film 32B is connected to the connection pad of the first upper-layer wiring 33A via an opening 71 provided in the second upper-layer insulating film 32B. On the upper surfaces of the second upper-layer insulating film 32B and the second upper-layer wirings 33B, an upper-layer overcoat film 36 is provided. The openings 37 are provided in the upper-layer overcoat film 36 in the portions corresponding to connection pads of the second upper-layer wirings 33B. Note that, each of the lower-layer wirings and the upper-layer wirings may have three-layer or more multi-layer wiring structure.

(Fourth Embodiment)

Figure 20:
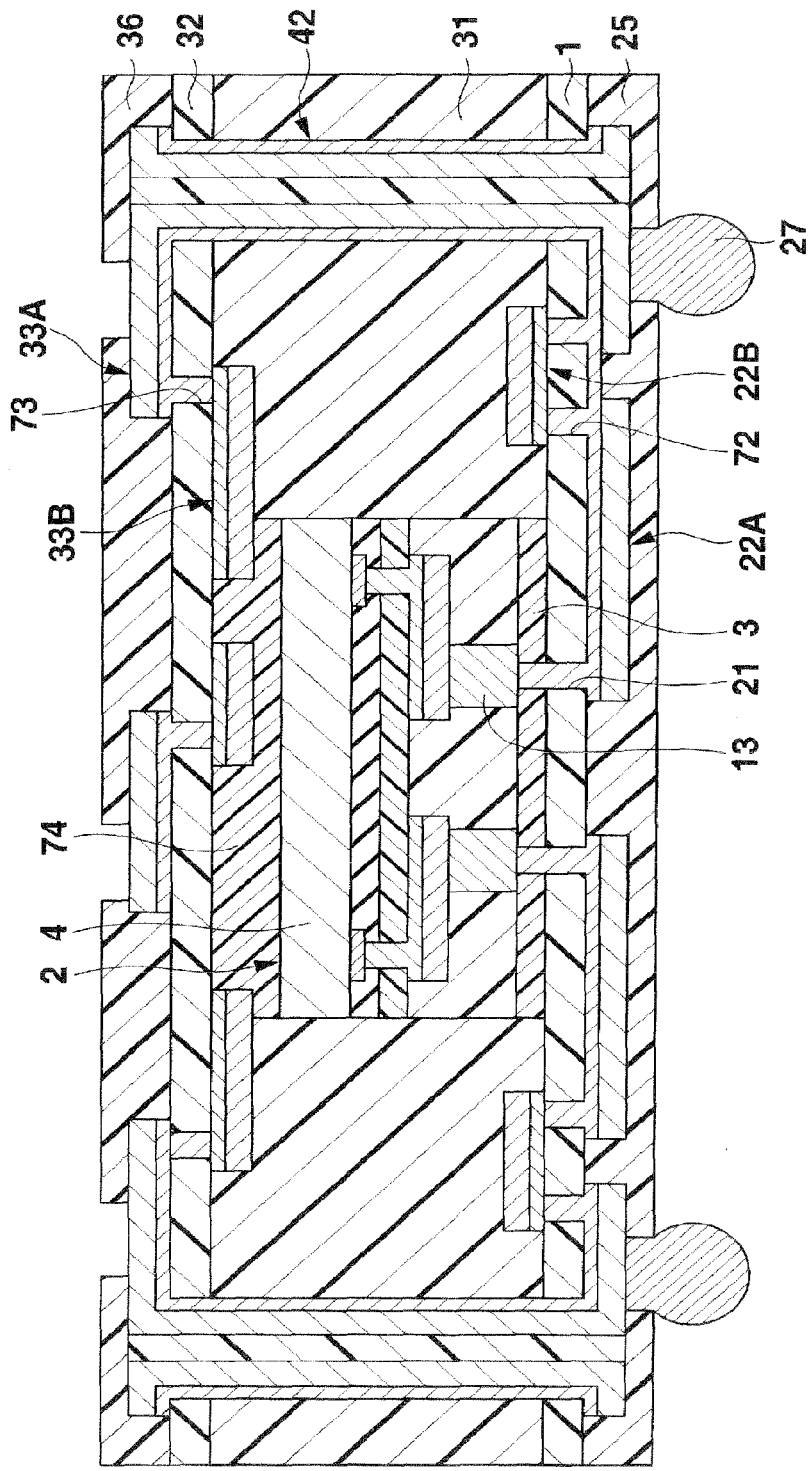
FIG. 20 is a cross-sectional view of a semiconductor device as a fourth embodiment of the present invention.

FIG. 20 is a cross-sectional view of a semiconductor device as the fourth embodiment of the present invention. What greatly differs from the semiconductor device shown in FIG. 1 in this semiconductor device is the point that the second lower-layer wiring 22B is provided on the upper surface of the lower-layer insulating film 1 in the periphery of the semiconductor constituent 2 and the second upper-layer wiring 33B is provided on the lower surface of the upper-layer insulating film 32.

The first lower-layer wiring 22A provided on the lower surface of the lower-layer insulating film 1 is connected to the connection pad of the second lower-layer wiring 22B via an opening 72 formed in the lower-layer insulating film 1. The first upper-layer wiring 33A provided on the upper surface of the upper-layer insulating film 32 is connected to the connection pad of the second upper-layer wiring 33B via an opening 73 formed in the upper-layer insulating film 32. Note that, in this case, the upper surface of the silicon substrate 4 of the semiconductor constituent 2 is bonded to the lower-surface center portion of the upper-layer insulating film 32 and the second upper-layer wirings 33B via an adhesive layer 74.

Figure 21:
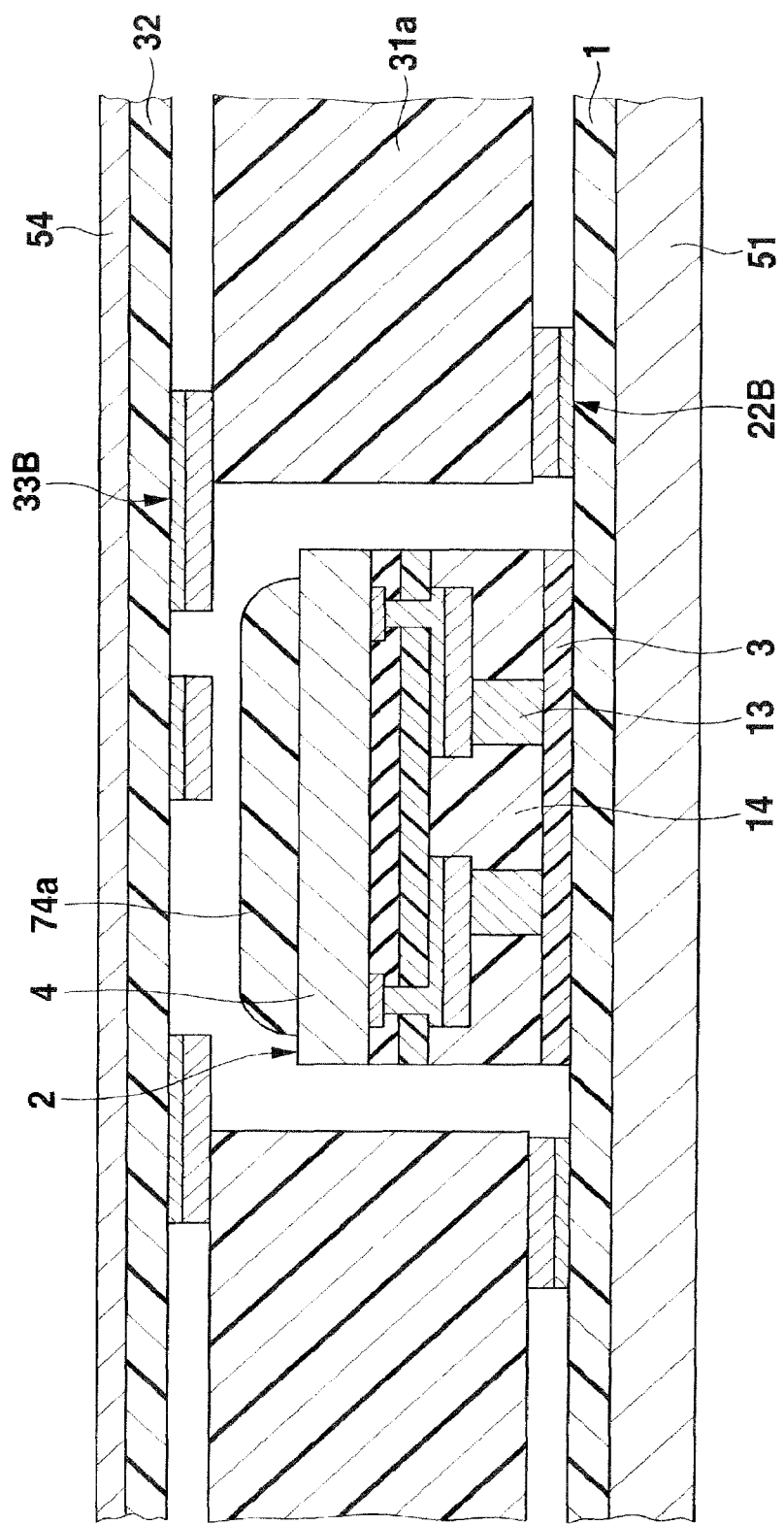
FIG. 21 is a cross-sectional view of an initial step in one example of a method for manufacturing the semiconductor device shown in FIG. 20.

Next, referring to FIG. 21, the initial step in one example of the method for manufacturing this semiconductor device of FIG. 20 will be described. In this case, on the upper surface of the lower layer insulating film 1 formed on the upper surface of the base plate 51, the second lower-layer wirings 22B each of a two-layer structure composed of a metallic underlayer made of electroless copper plating and a metallic upperlayer made of electrolytic copper plating are formed. Thermosetting resin made of epoxy resin or the like in the upper-layer insulating film 32 formed on the lower surface of the sub-base plate 54 has already been hardened. On the bottom surface of the upper-layer insulating film 32, the second upper-layer wirings 33B each of a two-layer structure composed of the metallic underlayer made of electroless copper plating and the metallic upperlayer made of electrolytic copper plating are formed.

Now, in the initial step, first of all, the semiconductor constituents 2 are mounted on the semiconductor constituent mounting areas on the upper surface of the lower-layer insulating film 1 by bonding the lower surfaces of the columnar electrodes 13 of the semiconductor constituents 2 and the sealing films 14 by the adhesive layers 3. Then, on the upper surface of the lower-layer insulating film 1 and the second lower-layer wirings 22B in the peripheries of the semiconductor constituents 2 and the adhesive layers 3, the lattice-shaped insulation layer forming sheet 31a is fixed.

Then, on the upper surface of the silicon substrate 4 of the semiconductor constituent 2, using a dispenser or the like, a liquid-form binding material 74a made of epoxy resin or the like is applied. Next, on the upper surface of the insulation layer forming sheet 31a, the sub-base plate 54 is disposed, on the lower surface of which the upper-layer insulating film 32 and the second upper-layer wiring 33B have been formed. Next, using a pair of hot-pressing plates, the resultant unit is hot-pressed from top and bottom and thereafter undergoing the same step as in the case of the first embodiment, and a plurality of semiconductor devices shown in FIG. 20 are obtained.

In the semiconductor devices obtained in this way, as compared to the semiconductor devices shown in FIG. 19, even when the lower-layer wiring and the upper-layer wiring are made into two-layer wiring structure, since the lower-layer insulating film and the upper-layer insulating film are made into a single layer, the semiconductor device can be low-profiled by just that much. Note that, in the hot-pressing process using a pair of hot-pressing plates, the adhesive layer 74 may be omitted if fluidized thermosetting resin in the insulation layer forming sheet 31a satisfactorily gets into the upper surface of the silicon substrate 4 of the semiconductor constituent 2.

(Fifth Embodiment)

Figure 22:
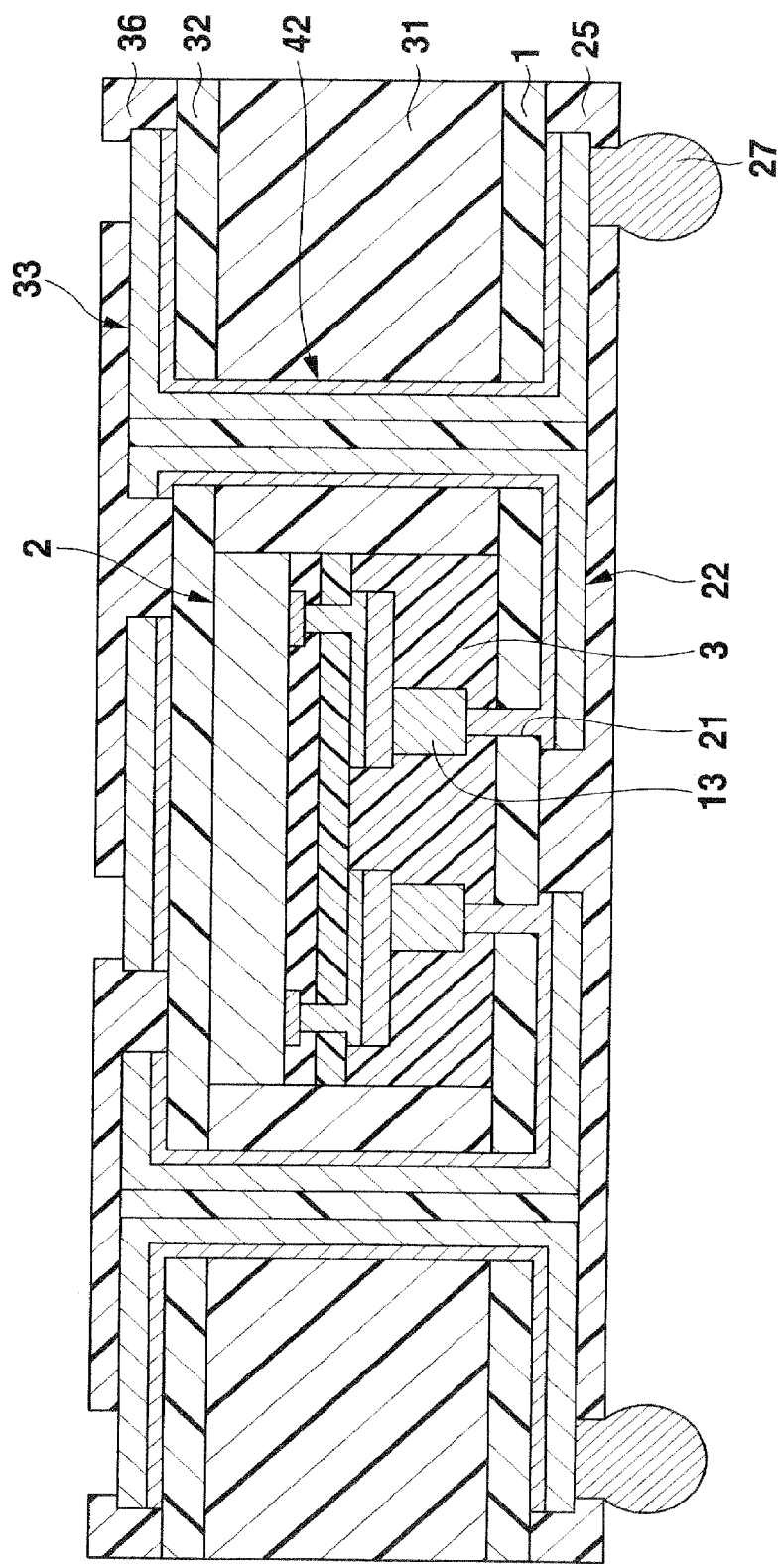
FIG. 22 is a cross-sectional view of a semiconductor device as a fifth embodiment of the present invention.

FIG. 22 is a cross-sectional view of a semiconductor device as the fifth embodiment of the present invention. What greatly differs from the semiconductor device shown in FIG. 1 in this semiconductor device is the point that the semiconductor constituent 2 has no sealing film 14. Consequently, in this case, lower surfaces of the wirings 10, columnar electrodes 13, and passivation film 8 of the semiconductor constituent 2 are directly bonded to the upper-surface center portion of the lower-layer insulating film 1 via the adhesive layer 3. One end part of the lower-layer wiring 22 is connected to the columnar electrode 13 of the semiconductor constituent 2 via the opening 21 of the lower-layer insulating film 1 and the adhesive layer 3.

(Sixth Embodiment)

Figure 23:
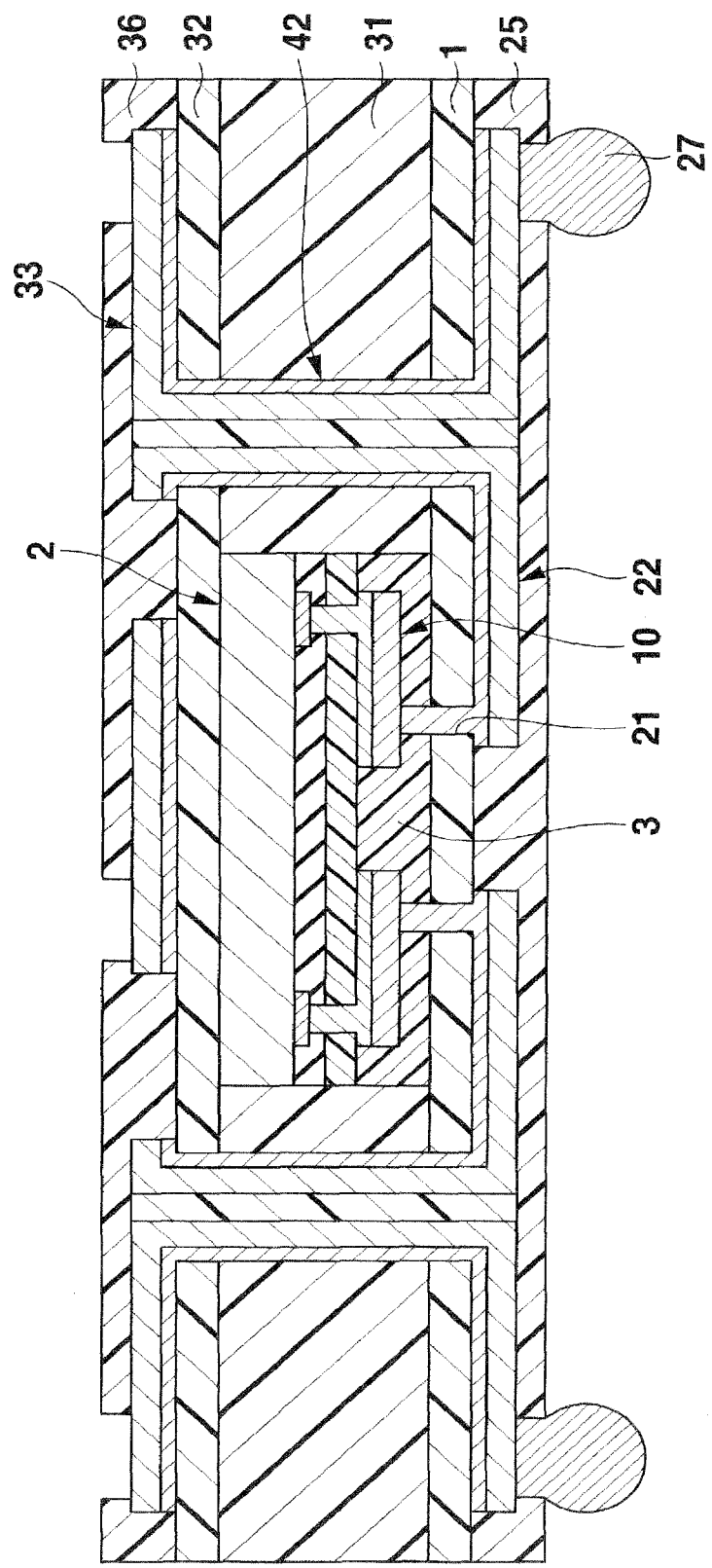
FIG. 23 is a cross-sectional view of a semiconductor device as a sixth embodiment of the present invention.

FIG. 23 is a cross-sectional view of a semiconductor device as the sixth embodiment of the present invention. What differs from the semiconductor device shown in FIG. 22 in this semiconductor device is the point that the semiconductor constituent 2 is not equipped with columnar electrodes 13. Consequently, in this case, the lower surface of the passivation film 8 and the wirings 10 of the semiconductor constituent 2 are bonded to the upper surface center portion of the lower-layer insulating film 1 via the adhesive layer 3. One end part of the lower-layer wiring 22 is connected to connection the of the wiring (electrode for external connection) 10 of the semiconductor constituent 2 via the opening 21 of the lower-layer insulating film 1 and the adhesive layer 3.

(Seventh Embodiment)

Figure 24:
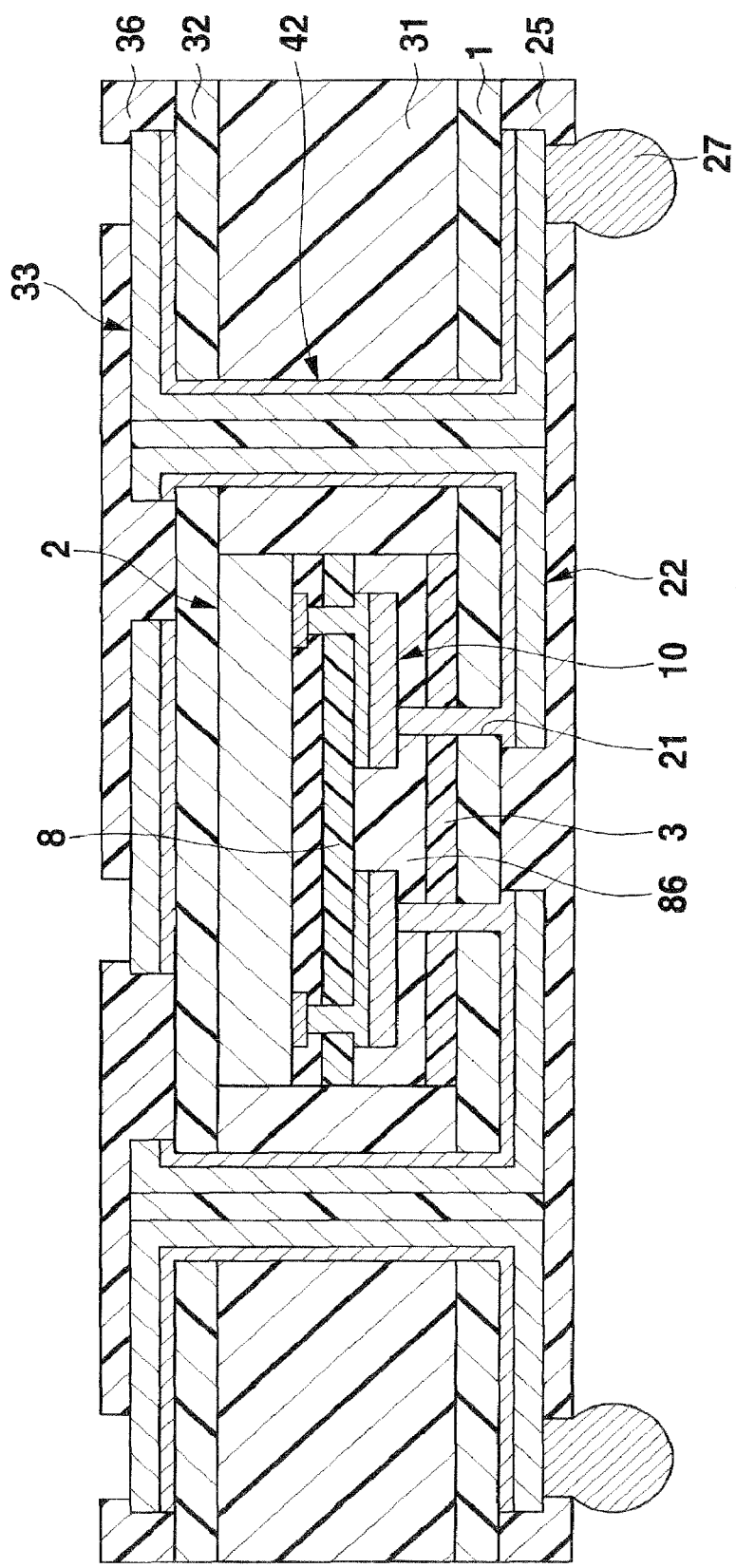
FIG. 24 is a cross-sectional view of a semiconductor device as a seventh embodiment of the present invention.

FIG. 24 is a cross-sectional view of a semiconductor device as the seventh embodiment of the present invention. What differs from the semiconductor device shown in FIG. 23 in this semiconductor device is the point that on the lower surfaces of the passivation film 8 and the wirings 10 of the semiconductor constituent 2, a passivation film 86 for static protection made of the insulating material such as polyimide resin or epoxy resin is provided. Consequently, in this case, the lower surface of the antistatic passivation film 86 of the semiconductor constituent 2 is bonded to the upper surface center portion of the lower-layer insulating film 1 via the adhesive layer 3. One end part of the lower-layer wiring 22 is connected to the connection pad of the wiring 10 of the semiconductor constituent 2 via the opening 21 of the lower-layer insulating film 1, adhesive layer 3, and passivation film 86.

Note that, before the semiconductor constituent 2 is mounted onto the lower-layer insulating film 1, no opening 21 is formed in the passivation film 86. The passivation film 86 which has no opening 21 protects the integrated circuit formed under the silicon substrate 4 from static electricity since the passivation film itself is formed under the silicon substrate 4 in the wafer state until the semiconductor constituent 2 is mounted onto the lower-layer insulating film 1.

(Eighth Embodiment)

Figure 25:
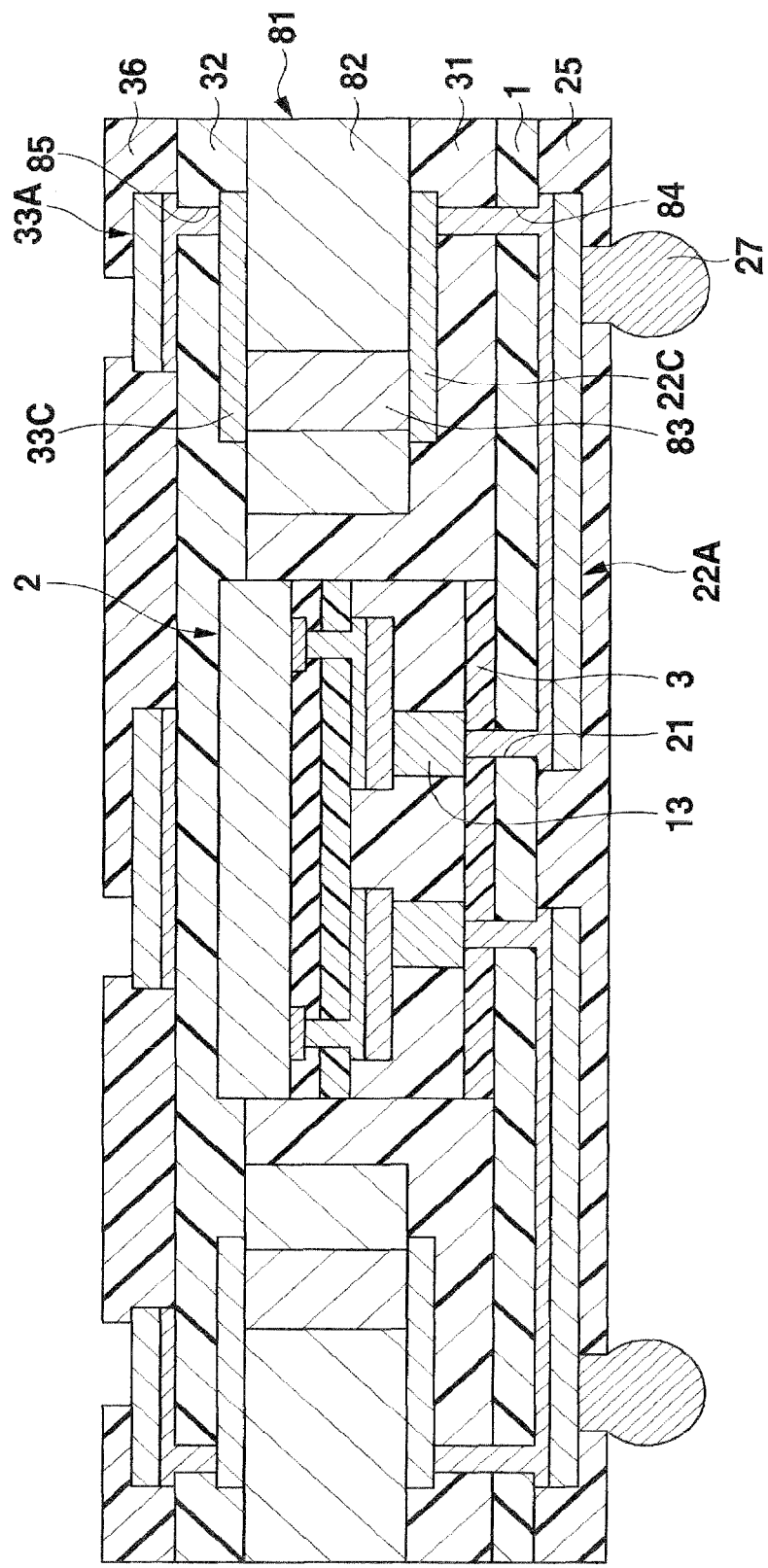
FIG. 25 is a cross-sectional view of a semiconductor device as an eighth embodiment of the present invention.

FIG. 25 is a cross-sectional view of a semiconductor device as the eighth embodiment of the present invention. What greatly differs from the semiconductor device shown in FIG. 1 in this semiconductor device is the point that the semiconductor device has no vertical conducting unit 42. In this embodiment, around the semiconductor constituent 2, a circuit substrate 81 of a square frame shape and double-sided wiring structure is disposed, and top and bottom wirings are allowed to conduct via a conductive layer provided on this circuit substrate.

That is, the circuit substrate 81 is equipped with a square-frame-shape substrate 82 made of glass-fabric substrate epoxy resin or the like. A plurality of second lower-layer wirings (intermediate wirings) 22C made of copper foil are provided on the lower surface of the substrate 82, and a plurality of second upper-layer wirings (intermediate wirings) 33C made of copper foil are provided on the upper surface thereof. The second lower-layer wiring 22C and the second upper-layer wiring 33C are connected via a vertical conducting unit 83 made of conductive paste or the like provided on the inside of the substrate 82.

The circuit substrate 81 having a central rectangular opening is disposed with intervals provided around the semiconductor constituent 2 in a state merged into the upper side of the insulation layer 31, and the insulation layer 31 is provided between the circuit substrate 81 and the lower-layer insulating film 1 and between the circuit substrate 81 and the semiconductor constituent 2. The upper-layer insulating film 32 is provided on the upper surfaces of the semiconductor constituent 2, circuit substrate 81 and insulation layer 31.

The first lower-layer wiring 22A provided to the lower surface of the lower-layer insulating film 1 is electrically connected to the connection pad of the second lower-layer wiring 22C via an opening 84 formed in the lower-layer insulating film 1 and the insulation layer 31. The first upper-layer wiring 33A provided on the upper surface of the upper-layer insulating film 32 is connected to the connection pad of the second upper layer wiring 33C via an opening 85 formed in the upper-layer insulating film 32.

Figure 26:
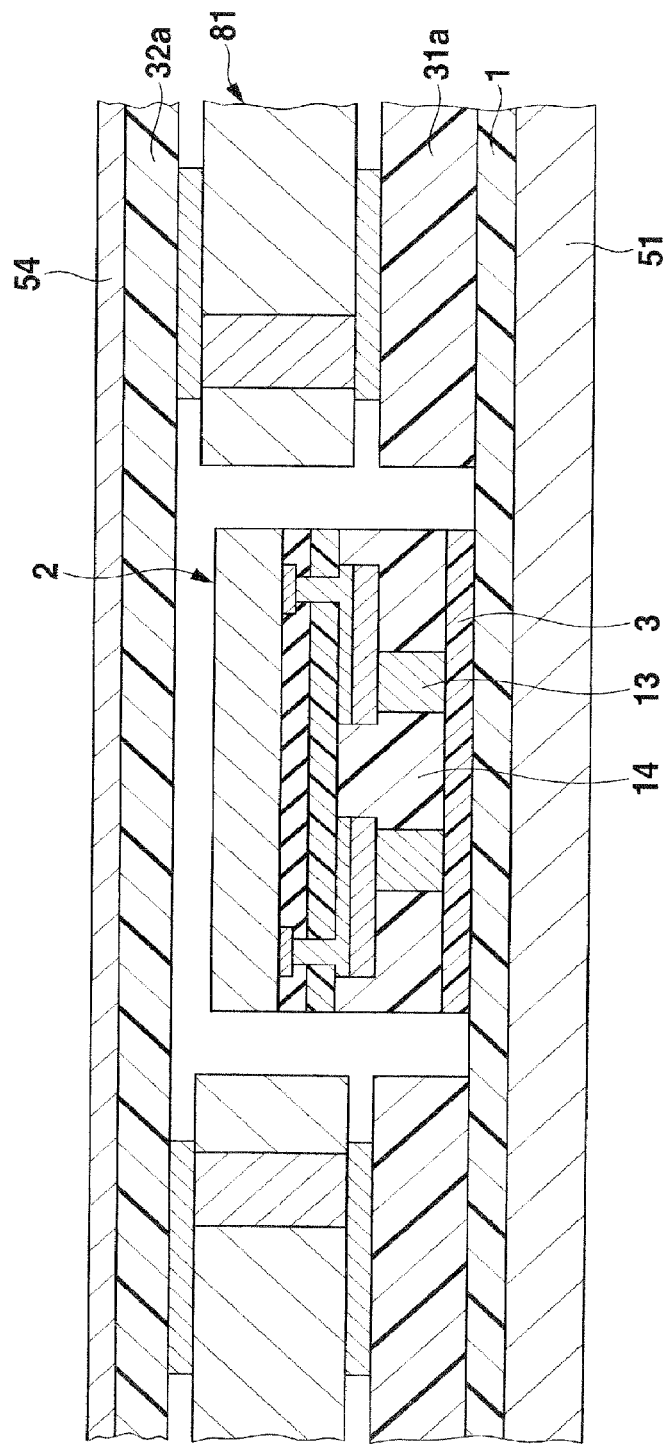
FIG. 26 is a cross-sectional view of an initial step in one example of a method for manufacturing the semiconductor device shown in FIG. 25.

Next, referring to FIG. 26, the initial step in one example of the method for manufacturing this semiconductor device of FIG. 25 will be described. First of all, by bonding the lower surfaces of the columnar electrodes 13 of the semiconductor constituents 2 and the sealing films 14 by the adhesive layers 3, the semiconductor constituents 2 are mounted on the semiconductor constituent mounting areas of the upper surface of the lower-layer insulating film 1. Then, the lattice-shape insulation layer forming sheet 31a is disposed on the upper surface of the lower-layer insulating film 1 in the peripheries of the adhesive layers 3 and the semiconductor constituents 2.

Next, the lattice-shape circuit substrate 81 is disposed on the upper surface of the insulation layer forming sheet 31a. Then, on the upper surface of the circuit substrate 81, the sub-base plate 54 is disposed, on the lower surface of which the upper-layer insulating film forming layers 32a have been formed. Next, using a pair of hot-pressing plates, the resultant unit is hot-pressed from top and bottom, and thereafter, undergoing the same process as the case of the first embodiment (however, except the vertical conducting unit 41 forming process or the circuit substrate 81 is cut in the cutting process) can produce a plurality of semiconductor devices shown in FIG. 25.

(Ninth Embodiment)

Figure 27:
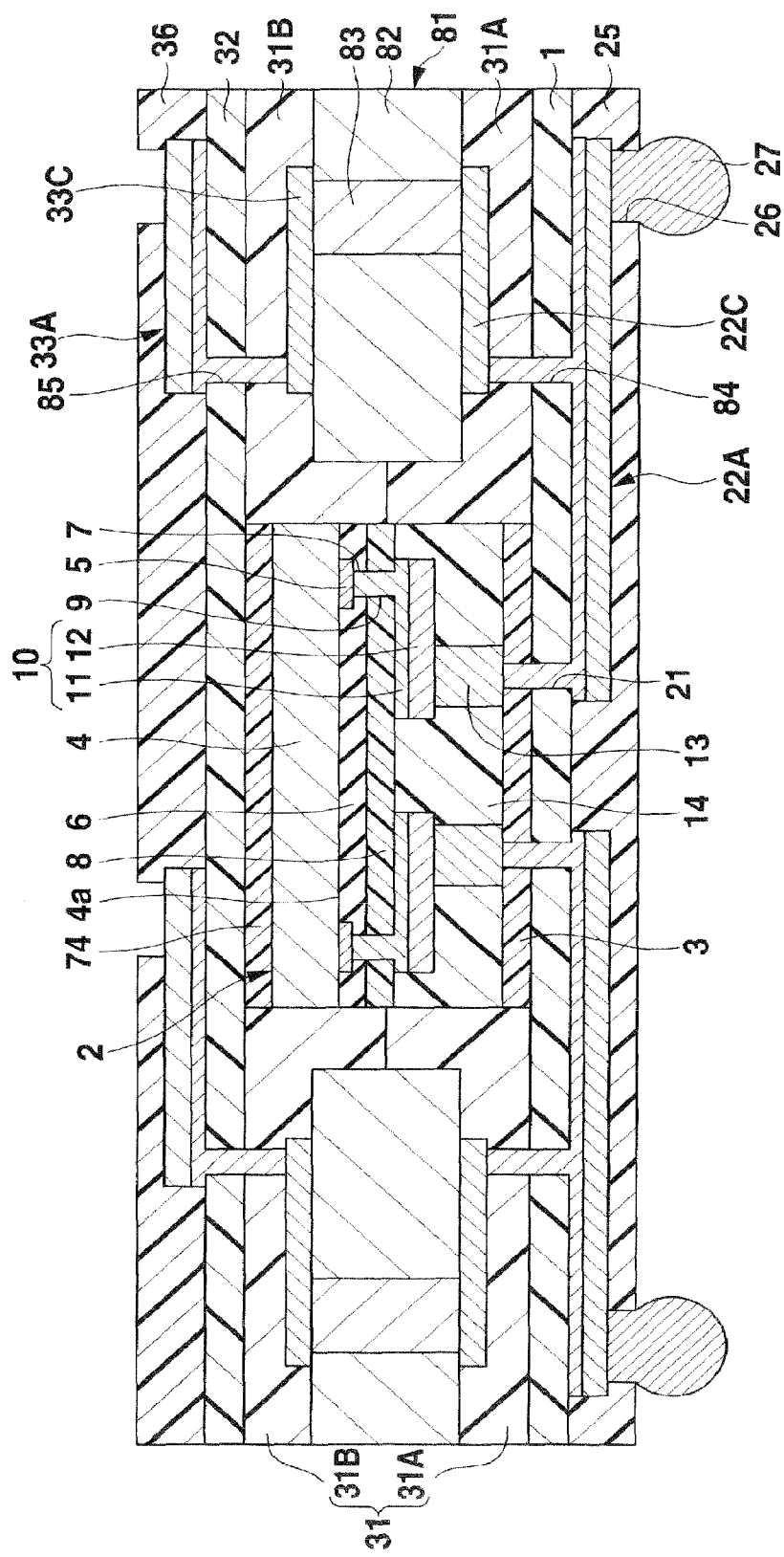
FIG. 27 is a cross-sectional view of a semiconductor device as a ninth embodiment of the present invention.

FIG. 27 is a cross-sectional view of a semiconductor device as the ninth embodiment of the present invention. What greatly differs from the semiconductor device shown in FIG. 25 in this semiconductor device is the point that the circuit substrate 81 is embedded in the center portion of the insulation layer 31 and the number of insulation layers of the whole semiconductor device is symmetric with respect to the through-thickness center of the circuit substrate 81.

Figure 28:
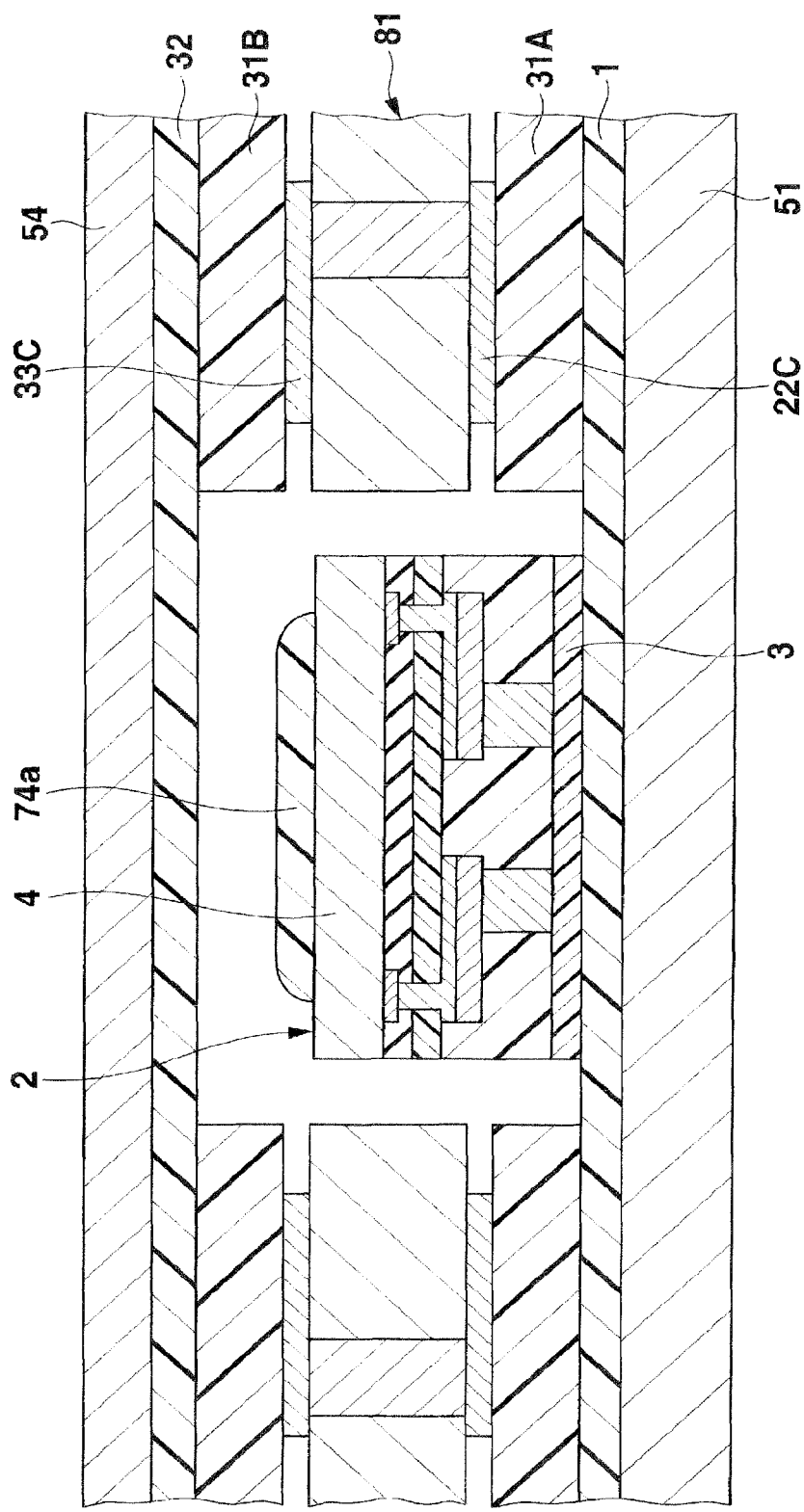
FIG. 28 is a cross-sectional view for explaining a method for manufacturing the semiconductor device shown in FIG. 27.

That is, the insulation layer 31 is composed of a lower-side insulation layer 31A and an upper-side insulation layer 31B of the same thickness, and the circuit substrate 81 has their through-thickness centers allowed to coincide with the boundary surface between the lower-side insulation layer 31A and the upper-side insulation layer 31B. In addition, the upper surface of the silicon substrate 4 of the semiconductor constituent 2 is bonded to the upper-layer insulating film 32 by the adhesive layer 74a. To obtain this kind of semiconductor device, as shown in FIG. 28, a lower-side insulation layer forming sheet 31a (shown as 31A in FIG. 28) is disposed on the upper surface of the lower-layer insulating film 1 and then, the lattice-shape circuit substrate 81 is disposed on the lower-side insulation layer forming sheet 31A. Then, the lattice-shape upper-side insulation layer forming sheet 31B is disposed on the upper surface of the circuit substrate 81 and a liquid-form adhesive material 74a made of epoxy resin or the like is applied on the upper surface of the silicon substrate 4 of the semiconductor constituent 2 by the use of a dispenser or the like. Next, on the upper surface of the upper-side insulation layer forming sheet 31B, the sub-base plate 54 made of copper foil is disposed, on the lower surface of which the upper-layer insulating film 32 is formed; then, the condition of FIG. 28 is obtained. Thereafter, as is the case of other embodiments, using a pair of hot-pressing plates 55 and 56, the lower-side insulation layer forming sheet 31Aa, upper-side insulation layer forming sheet 31B and adhesive materials 74a are hot-pressed from top and bottom of the resultant unit. Note that, in the foregoing embodiment, description was made with the insulation layer 31 formed by two insulation layer forming sheets, but the insulation layer 31 can be formed not by two sheets only but by laminating a plurality of insulation layer forming sheets. No matter how many insulation layer forming sheets are used, it is desirable that the circuit substrate 81 is positioned with the through-thickness center allowed to coincide with the through-thickness center of the insulation layer 31. In addition, it is desirable that the whole semiconductor device not only has the same number of insulation layers with respect to the through-thickness center of the circuit substrate 81 but also has the identical thickness of each corresponding insulation layer.

(Other Modified Examples)

The structure in which the circuit substrate 81 is embedded in the insulation layer 31 shown in the eighth and ninth embodiments is also applicable to the second to seventh embodiments. In addition, the semiconductor device of the present invention and the method for manufacturing the same can be variously modified and applied in accordance with their purposes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    forming a lower-layer insulating film on a base plate;
    fixing, on the lower-layer insulating film, a plurality of semiconductor constituents each having a semiconductor substrate and a plurality of electrodes for external connection provided under the semiconductor substrate;
    forming an insulation layer on the lower-layer insulating film at peripheries of the semiconductor constituents and forming an upper-layer insulating film on the semiconductor constituents and the insulation layer;
    removing the base plate;
    forming lower-layer wirings connected with the electrodes for external connection of the semiconductor constituents under the lower-layer insulating film and forming upper-layer wirings on the upper-layer insulating film; and
    obtaining a plurality of semiconductor devices by cutting the lower-layer insulating film, the insulation layer, and the upper-layer insulating film between the semiconductor constituents;
    wherein forming the lower-layer insulating film on the base plate includes forming a lower-layer protection metal layer and a lower-layer metallic underlayer on the base plate, and forming the lower-layer insulating film on the lower-layer metallic underlayer; and
    wherein removing the base plate includes removing the lower-layer protection metal layer.

2. The method for manufacturing a semiconductor device according to claim 1, wherein fixing said plurality of semiconductor constituents on the lower-layer insulating film includes supplying a liquid-form adhesive material onto the lower-layer insulating film in advance and hot-pressing the semiconductor constituents onto the lower-layer insulating film.

3. The method for manufacturing a semiconductor device according to claim 1, wherein fixing said plurality of semiconductor constituents on the lower-layer insulating film includes supplying a sheet-form adhesive material onto the lower-layer insulating film in advance and hot-pressing the semiconductor constituents onto the lower-layer insulating film.

4. The method for manufacturing a semiconductor device according to claim 1, wherein forming the lower-layer wirings and the upper-layer wirings includes forming through holes in the lower-layer insulating film, the insulation layer, and the upper-layer insulating film, and forming vertical conducting units inside the through holes to be connected with the lower-layer wirings and the upper-layer wirings.

5. The method for manufacturing a semiconductor device according to claim 1, further comprising:
    forming further lower-layer wirings at peripheries of semiconductor constituent mounting areas on the lower-layer insulating film, and forming further upper-layer wirings under the upper-layer insulating film, the lower-layer wirings being formed to be connected with the further lower-layer wirings, and the upper-layer wirings being formed to be connected with the further upper-layer wirings.

6. The method for manufacturing a semiconductor device according to claim 1, wherein forming the insulation layer and the upper-layer wirings includes arranging a circuit substrate having further lower-layer wirings, further upper-layer wirings, and vertical conducting units which connect the wirings on the insulation layer under the upper-layer wirings at peripheries of the semiconductor constituents, and wherein the lower-layer wirings are formed to be connected to the further lower-layer wirings, and the upper-layer wirings are formed to be connected to the further upper-layer wirings.

7. The method for manufacturing a semiconductor device according to claim 1, wherein the upper-layer insulating film is initially formed under a sub-base plate, and the method further comprises removing the sub-base plate.

8. The method for manufacturing a semiconductor device according to claim 7, wherein forming the upper-layer insulating film on the semiconductor constituents and the insulation layer includes forming an upper-layer protection metal layer and an upper-layer metallic underlayer under the sub-base plate, and forming the upper-layer insulating film under the upper-layer metallic underlayer.

9. The method for manufacturing a semiconductor device according to claim 8, wherein removing the sub-base plate includes removing the upper-layer protection metal layer.

10. The method for manufacturing a semiconductor device according to claim 8, wherein forming the lower-layer insulating film on the lower-layer metallic underlayer includes carrying out surface roughening treatment in advance on an upper surface of the lower-layer metallic underlayer, and forming the upper-layer insulating film under the upper-layer metallic underlayer includes carrying out surface roughening treatment in advance on a lower surface of the upper-layer metallic underlayer.

11. The method for manufacturing a semiconductor device according to claim 1, wherein forming the lower-layer wiring includes forming the lower-layer metallic underlayer, another lower-layer metallic underlayer, and a lower-layer metallic upperlayer by electrolytic plating under the lower-layer insulating film in that order.

12. The method for manufacturing a semiconductor device according to claim 11, wherein forming the upper-layer wiring includes forming an upper-layer metallic underlayer, another upper-layer metallic underlayer, and an upper-layer metallic upperlayer by electrolytic plating on the upper-layer insulating film in that order.

13. The method for manufacturing a semiconductor device according to claim 12, wherein the upper-layer insulating film is initially formed under a sub-base plate and removing the base plate includes removing the sub-base plate;
    wherein forming the upper-layer insulating film on the semiconductor constituents and the insulation layer includes forming an upper-layer protection metal layer and the upper-layer metallic underlayer under the sub-base plate, and forming the upper-layer insulating film under the upper-layer metallic underlayer; and
    wherein the base plate, the lower-layer metallic underlayer, the another lower-layer metallic underlayer, the lower-layer metallic upperlayer, the sub-base plate, the upper-layer metallic underlayer, the another upper-layer metallic underlayer, and the upper-layer metallic upperlayer are made of copper, and the lower-layer protection metal layer and the upper-layer protection metal layer are made of nickel.

14. A method for manufacturing a semiconductor device, comprising:

forming a lower-layer insulating film on a base plate;

fixing, on the lower-layer insulating film, a plurality of semiconductor constituents each having a semiconductor substrate and a plurality of electrodes for external connection provided under the semiconductor substrate;

forming a lower-side insulation layer and an upper-side insulation layer on an upper side of the lower-layer insulating film at peripheries of the semiconductor constituents, and providing a circuit substrate having intermediate wirings between the lower-side insulation layer and the upper-side insulation layer, and forming an upper-layer insulating film on the semiconductor constituents and the upper-side insulation layer;

removing the base plate from the lower-layer insulating film;

forming lower-layer wirings to be connected to electrodes for external connection of the semiconductor constituents and the intermediate wirings of the circuit substrate under the lower-side insulating film, and forming upper-layer wirings to be connected to the intermediate wirings of the circuit substrate on the upper-layer insulating film; and cutting the lower-layer insulating film, the lower-layer insulation layer, the circuit substrate, the upper-layer insulation layer, and the upper-layer insulating film between the semiconductor constituents, to obtain a plurality of semiconductor devices;

wherein forming the lower-layer insulating film on the base plate includes forming a lower-layer protection metal layer and a lower-layer metallic underlayer on the base plate, and forming the lower-layer insulating film on the lower-layer metallic underlayer; and wherein removing the base plate includes removing the lower-layer protection metal layer.

15. The method for manufacturing a semiconductor device according to claim 14, wherein the intermediate wirings of the circuit substrate are formed on an upper surface and a lower surface of the circuit substrate, and the circuit substrate has vertical conducting units which connect the intermediate wirings formed on the upper surface and the lower surface.

* * * * *